(12) United States Patent
Chen et al.

(10) Patent No.: US 12,209,596 B2
(45) Date of Patent: Jan. 28, 2025

(54) CONFIGURABLE BI-DIRECTIONAL AIRFLOW FAN

(71) Applicant: Cisco Technology, Inc., San Jose, CA (US)

(72) Inventors: Yongguo Chen, Shanghai (CN); Peter Christopher McLean, Sunnyvale, CA (US); Vic Hong Chia, Sunnyvale, CA (US); Zahid Naveed Aziz, Newark, CA (US); Harvey Yang, Tracy, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 18/353,596

(22) Filed: Jul. 17, 2023

(65) Prior Publication Data
US 2024/0102491 A1    Mar. 28, 2024

Related U.S. Application Data

(60) Provisional application No. 63/410,590, filed on Sep. 27, 2022.

(51) Int. Cl.
*F04D 29/64* (2006.01)
*F04D 5/00* (2006.01)
(Continued)

(52) U.S. Cl.
CPC ......... *F04D 29/644* (2013.01); *F04D 29/522* (2013.01); *F04D 5/005* (2013.01);
(Continued)

(58) Field of Classification Search
CPC .......... F04D 5/003; F04D 5/005; F04D 5/006; F04D 5/007; F04D 15/0016; F04D 15/0022; F04D 19/005; F04D 29/2283; F04D 29/4246; F04D 29/4293; F04D 29/48; F04D 29/50; F04D 29/522; F04D 29/644

See application file for complete search history.

(56) References Cited

U.S. PATENT DOCUMENTS 3,751,179 A * 8/1973 Wassmann .......... F04D 29/2283
415/206
4,219,325 A * 8/1980 Gutzwiller .............. F04D 29/12
417/373

(Continued)

*Primary Examiner* — Binh Q Tran
(74) *Attorney, Agent, or Firm* — Ravi Mohan; Rutan & Tucker, LLP

(57) ABSTRACT

Various devices, systems, and methods are described herein that provide bi-directional, and even multi-directional airflow within fan systems. These fan systems can be utilized by devices such as datacenter switches to change from one direction of airflow (such as port side inlet) to another direction (such as port side exhaust). This can be done manually by having a multi-directional fan housed within an enclosure that provides access through a hatch door. The multi-directional fan can be removed and reoriented to a second direction, thus providing airflow with the same quality and pressure in multiple directions. Fan changes can also be automated through one or more interlocking rotational gears coupled to the fans within a housing, such that rotating one gear will rotate each of the fans within the housing, thus changing the direction of the airflow. By doing this, only one fan is needed to provide airflow in multiple directions.

18 Claims, 17 Drawing Sheets

(51) Int. Cl.
    *F04D 15/00*    (2006.01)
    *F04D 19/00*    (2006.01)
    *F04D 29/22*    (2006.01)
    *F04D 29/52*    (2006.01)
    *H05K 7/20*     (2006.01)

(52) U.S. Cl.
    CPC .......... *F04D 5/007* (2013.01); *F04D 15/0016* (2013.01); *F04D 15/0022* (2013.01); *F04D 19/005* (2013.01); *F04D 29/2283* (2013.01); *H05K 7/20718* (2013.01)

(56) References Cited

U.S. PATENT DOCUMENTS

| | | | |
|---|---|---|---|
| 8,068,340 B1 | 11/2011 | Nguyen et al. | |
| 11,079,126 B2* | 8/2021 | Saunders | F24F 11/77 |
| 2006/0078428 A1* | 4/2006 | Zheng | F04D 29/424 |
| | | | 415/206 |
| 2008/0063532 A1* | 3/2008 | Hsu | F04D 25/166 |
| | | | 416/223 R |
| 2013/0011251 A1* | 1/2013 | Franco de Oliveira Falcao | ......... |
| | | | F03B 13/142 |
| | | | 415/208.2 |
| 2016/0312792 A1* | 10/2016 | Fujimaki | F04D 29/667 |
| 2016/0369815 A1 | 12/2016 | Wilcox et al. | |
| 2018/0100512 A1 | 4/2018 | Chen et al. | |
| 2021/0007240 A1 | 1/2021 | Badihi et al. | |
| 2021/0282296 A1 | 9/2021 | Shabtay et al. | |
| 2021/0400841 A1* | 12/2021 | Okumura | H05K 7/20727 |

\* cited by examiner

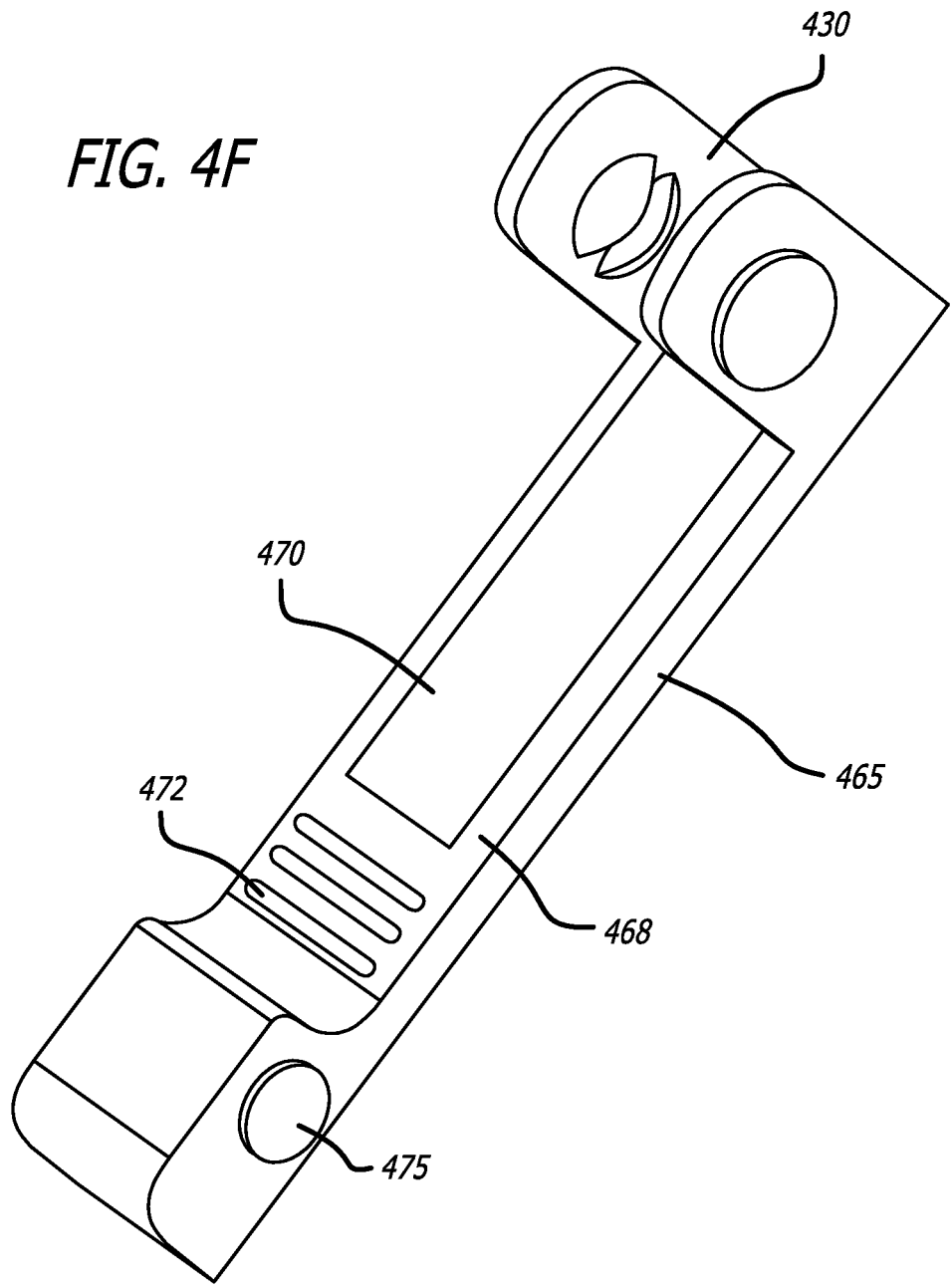

CONFIGURABLE BI-DIRECTIONAL AIRFLOW FAN

PRIORITY

This patent application claims the benefit of U.S. Provisional Patent Application Ser. No. 63/410,590 entitled "Configurable Bi-Directional Airflow Fan," filed Sep. 27, 2022, which such application is hereby incorporated in its entirety here by this reference.

TECHNICAL FIELD

The present disclosure relates to fan systems. More particularly, the present disclosure relates to creating a bi-directional airflow with a single fan configurable either manually or automatically.

BACKGROUND

Often, data center switches need to meet two airflow directions. The first direction is a port side inlet (PSI) direction, and the second direction is a port side exhaust (PSE). Traditional methods of achieving these directions include designing two kinds of fan modules that can each go in one orientation. The PSI direction includes fans designated as "red fans", while PSE direction fans are designated as "blue fans."

However, having two separate fans configured for unique directional operations creates the need to create multiple custom part numbers. This subsequently increases the required inventory needs to store and manage the multiple parts. Additionally, the quantity of parts needed for each fan design increase the overall procurement costs to source and build each unique design.

If a fan required a change in directional operation, traditional methods typically require the entire replacement of one fan design with an entirely different part. This situation would require the customer to obtain and manage two different fan designs. In certain deployments, the customer may not be able to easily access the fans to perform a swap or change of the fan units.

SUMMARY OF THE DISCLOSURE

Systems and methods for generating bi-directional airflow with a single fan that is configurable either manually or automatically are described herein in accordance with embodiments of the disclosure.

In some embodiments, a multi-directional fan system, includes a reconfigurable fan component, including a first fan opening on one end of the reconfigurable fan component and a second fan opening on another end of the reconfigurable fan component, a plurality of engagement components configured to secure the reconfigurable fan component in place with a fan housing. The fan housing may include a plurality of securing components configured to engage with the plurality of engagement components of the reconfigurable fan component to secure the reconfigurable fan component in place with the fan housing.

In some embodiments, a multi-direction fan system, wherein the multi-directional fan system is further configured to have an attached state wherein the reconfigurable fan component is securely attached to the fan housing, and a detached state wherein the reconfigurable fan component is detached from the fan housing.

In some embodiments, a multi-directional fan system, wherein the attached state further includes a first airflow state wherein the reconfigurable fan component is configured in a first position within the fan housing, and a second airflow state wherein the reconfigurable fan component is configured in a second position within the fan housing.

In some embodiments, a multi-directional fan system, wherein the second position of the reconfigurable fan component corresponds to a one-hundred-and-eighty-degree orientation with respect to the first position In some embodiments, a multi-directional fan system, wherein the first airflow state is associated with airflow in a first direction.

In some embodiments, a multi-directional fan system, wherein the second airflow state is associated with airflow in a second direction.

In some embodiments, a multi-directional fan system, wherein the first airflow state and the second airflow state are in opposing directions.

In some embodiments, a multi-directional fan system, wherein the engagement components of the fan housing include a pair of engagement receptors on opposing sides of the fan housing, the engagement components of the reconfigurable fan component include a pair of valleys on opposing sides of the reconfigurable fan component, and wherein a first insertion nub is configured to engage with a first engagement receptor and first valley, and a second insertion nub is configured to engage with a second engagement receptor and second valley.

In some embodiments, a multi-directional fan system, wherein the attached state is achieved via the engagement of a plurality of hinged securing members.

In some embodiments, a multi-directional fan system, wherein the plurality of hinged securing members is configured with at least one locking engagement component.

In some embodiments, a multi-directional fan system, wherein the locking engagement component is configured to engage with a corresponding through hole in the reconfigurable fan component.

In some embodiments, a multi-directional fan system, wherein the attached state is achieved via a securing tab.

In some embodiments, a multi-directional fan system, wherein the securing tab is configured to be secured via a pin component.

In some embodiments, a multi-directional fan system includes a fan housing including a plurality of securing components configured to engage with a plurality of engagement components of a reconfigurable fan component to secure the reconfigurable fan component in place with the fan housing, and a housing mating component configured to engage with a fan mating component. A reconfigurable fan component may include a first fan opening on one end of the reconfigurable fan component and a second fan opening on another end of the reconfigurable fan component, a plurality of engagement components configured to secure the reconfigurable fan component in place with a fan housing, a first fan mating component, and a second fan mating component.

In some embodiments, a multi-directional fan system, wherein the first fan mating component and second fan mating component are configured on opposing ends of the reconfigurable fan component.

In some embodiments, a multi-directional fan system, wherein the housing mating component is configured to deliver power to the reconfigurable fan component via an electrically coupled connection through one of the fan mating components.

In some embodiments, a multi-directional fan system, wherein the housing mating component is at least partially magnetized.

In some embodiments, a multi-directional fan system, wherein both the first and second fan mating component is at least partially magnetized.

In some embodiments, a method for reversing airflow of a multi-directional fan system includes accessing a reconfigurable fan component secured within a fan housing via a plurality of securing components, detaching one or more of the plurality of securing components, removing the reconfigurable fan component from the fan housing, rotating the reconfigurable fan component one-hundred-and-eighty-degrees, and placing the reconfigurable fan component back into the fan housing in the rotated position, and securing the reconfigurable fan module within the fan housing via a plurality of securing components.

In some embodiments, a method, wherein detaching and securing the multi-directional fan system does not require any tools.

Other objects, advantages, novel features, and further scope of applicability of the present disclosure will be set forth in part in the detailed description to follow, and in part will become apparent to those skilled in the art upon examination of the following or may be learned by practice of the disclosure. Although the description above contains many specificities, these should not be construed as limiting the scope of the disclosure but as merely providing illustrations of some of the presently preferred embodiments of the disclosure. As such, various other embodiments are possible within its scope. Accordingly, the scope of the disclosure should be determined not by the embodiments illustrated, but by the appended claims and their equivalents.

BRIEF DESCRIPTION OF THE DRAWINGS

FIG. 4F provides a perspective view of a locking mechanism as depicted in accordance with various embodiments of the disclosure;

Figure 1:
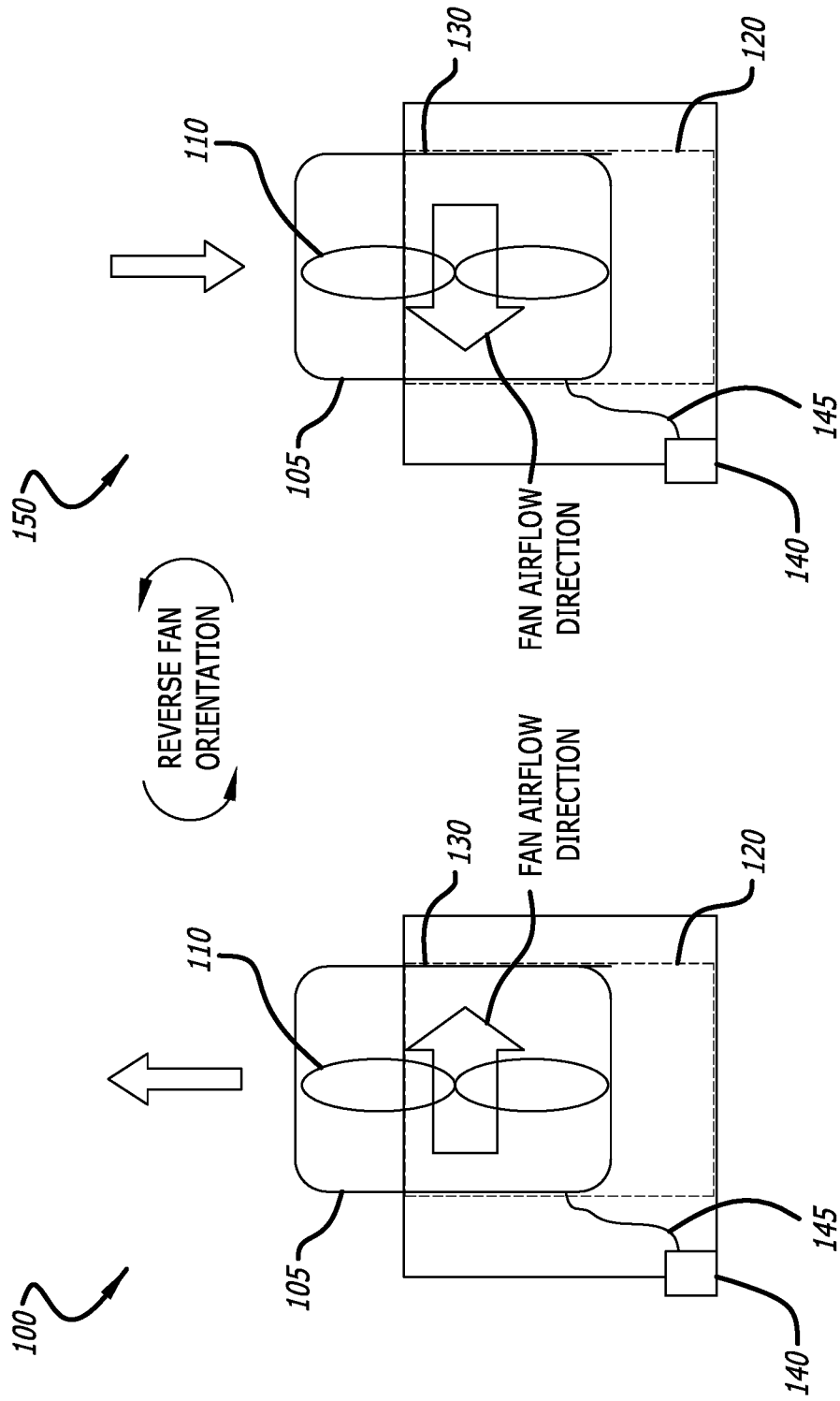
FIG. 1 provides a conceptual illustration of a reversible bi-directional fan system in accordance with various embodiments of the disclosure.

Corresponding reference characters indicate corresponding components throughout the several figures of the drawings. Elements in the several figures are illustrated for simplicity and clarity and have not necessarily been draw n to scale. For example, the dimensions of some of the elements in the figures might be emphasized relative to other elements for facilitating understanding of the various presently disclosed embodiments. In addition, common, but well-understood, elements that are useful or necessary in a commercially feasible embodiment are often not depicted in order to facilitate a less obstructed view of these various embodiments of the present disclosure.

DETAILED DESCRIPTION

Solutions to the problems presented by the traditional systems described above have been developed which change directions of the blades spinning within the fan housing. However, these designs fail to provide equal power and air pressure in each of the available directions. There is a desire to have a fan system capable of adjustment by the user that provides equal air pressure and quality to each direction such that at least a bi-directional airflow can be obtained.

In response to the problems described above, systems, methods, and devices are described here that allow for the manual and/or automatic change in orientation and thus resultant airflow direction of fans. In many embodiments, a fan configured for airflow in a first direction can be configured to be disposed within a housing tray enclosure within a device, such as, but not limited to, a network/data center switch.

At a certain time, the user may desire for the direction of the airflow to be changed or reversed, such as from PSI to PSE and vice versa. The user may manually open a hatch door on the tray enclosure where the fan is housed, lift the multi-directional fan unit out of the enclosure, change the orientation of the device, and re-insert it back into the housing enclosure for further operation in the new direction. This can allow for a reverse in the airflow for bi-directional operation, while retaining the same pressure and performance in each direction.

However, in certain embodiments, it may not be feasible or practical to manually change the fans orientation by removal and reinsertion by the user. This can be due to space constraints, remote locations, or other inaccessibility issues. In these cases, an automated bi-directional fan system can be utilized which rotate fans within the housing upon demand. This automatic rotation can be achieved through a variety of means. In various embodiments described in more detail below, a rotational gear can be physically coupled to each fan such that when a rotational gear rotates, the fan rotates a corresponding amount. Each fan may be coupled with a rotational gear, and each rotational gear may be couple or otherwise interlocked such that movement of one gear directs movement of the other gears. In this way, a step motor, or other translational device can direct the rotation of each of the fans within the automated bi-directional fan system.

Before some particular embodiments are provided in greater detail, it should be understood that the particular embodiments provided herein do not limit the scope of the concepts provided herein. It should also be understood that a particular embodiment provided herein can have features that can be readily separated from the particular embodiment and optionally combined with or substituted for features of any of a number of other embodiments provided herein.

Regarding terms used herein, it should also be understood the terms are for the purpose of describing some particular embodiments, and the terms do not limit the scope of the concepts provided herein. Ordinal numbers (e.g., first, second, third, etc.) are generally used to distinguish or identify different features or steps in a group of features or steps, and do not supply a serial or numerical limitation. For example, "first," "second," and "third" features or steps need not necessarily appear in that order, and the particular embodiments including such features or steps need not necessarily be limited to the three features or steps. Labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," and the like are used for convenience and are not intended to imply, for example, any particular fixed location, orientation, or direction. Instead, such labels are used to reflect, for example, relative location, orientation, or directions. Singular forms of "a," "an," and "the" include plural references unless the context clearly dictates otherwise. Finally, unless defined otherwise, all technical and scientific terms used herein have the same meaning as commonly understood by those of ordinary skill in the art.

Referring to FIG. 1, a conceptual illustration of a reversible bi-directional fan system 100 in accordance with various embodiments of the disclosure is shown. In many embodiments, the reversible bi-directional fan system 100 comprises a multi-directional fan 105 configured to blow air toward a first direction. As described above, the directions can be based on the application desired, and can include, but is not limited to, PSI and PSE. In a number of embodiments, the multi-directional fan 105 can include a plurality of fans 110 such that the multi-directional fan 105 is itself a housing for multiple smaller fans of potentially varying size and dimension.

In additional embodiments, the multi-directional fan 105 can be disposed within a tray enclosure 120 which is configured to house the multi-directional fan 105. For example, the tray enclosure 120 can be a cavity within a device that is configured to accept the multi-directional fan 105 during manufacture or deployment. In further embodiments, the tray enclosure 120 can be configured to have holes or other openings on multiple sides to provide passage for the flow of air from the multi-directional fan 105.

A hatch door 130 can also be incorporated as one side of the tray enclosure 120. The hatch door 130 can allow for the insertion and/or removal of the multi-directional fan 105. In most embodiments, a connector 140 will be available that can provide power to the bi-directional fan system 100. The connector can be fixed within the device housing the multi-directional fan 105 and/or tray enclosure 120.

During operation, there may become a need or desire to change the direction of airflow being provided by the multi-directional fan 105. In traditional methods, the entire fan system would need to be swapped out and replaced by a separate and unique part. Other methods may have reversed the direction of the fan blades, providing reversed airflow, but at a lower pressure and quality as the original directional airflow.

However, in many embodiments, the multi-directional fan 105 can be physically removed from the tray enclosure 120 (left side of FIG. 1), reversed, and inserted back into the tray enclosure 120 (right side of FIG. 1). In this way, the same pressure and quality can be maintained, and no additional parts are required. Furthermore, while the embodiment depicted in FIG. 1 shows a one-hundred-and-eighty-degree reversal between the first direction and the second direction, additional directions can be achieved depending on the orientation of the multi-directional fan 105 within the tray enclosure 120. In this way, a variety of unique orientations can be available depending on the shape of the multi-directional fan 105 and the air passage holes provided by the tray enclosure 120.

It should be appreciated that in many embodiments, the multi-directional fan 105 is equally effective regardless of its orientation. More specifically, it is envisioned that the multi-directional fan 105 can reverse its rotation seamlessly, resulting in consistent airflow patterns and predictable performance. In some embodiments, a position of the first fan opening and the second fan opening in the first airflow state are one-hundred-and-eighty-degrees from the positioning in the second airflow state. Similarly, in some embodiments, the multi-directional fan 105 is configured to provide a similar output of airflow in the first airflow state as the second airflow state. No matter if the multi-directional fan 105 is operating in the first or second airflow state, the reversible fan ensures a comparable output of air, enabling efficient cooling or ventilation in various applications. This versatility makes it an ideal choice for environments where the fan's orientation may change or where consistent airflow is crucial for maintaining optimal conditions.

In still further embodiments, reversing the airflow of the multi-direction fan system can comprise accessing the multi-directional fan 105 (i.e., the reconfigurable fan component) that is secured within a tray enclosure 120 (i.e., fan housing). Once accessed, one or more of a plurality of securing components may be detached, removed, or otherwise disengaged. As discussed in more detail below, there are a variety of ways and securing components that can be utilized to achieve one or more embodiments described herein. Once detached, the multi-directional fan 105 can be removed and rotated (typically one-hundred-and-eighty-degrees) before being reinserted or otherwise placed into the tray enclosure 120.

In other words, in a first airflow state the reconfigurable fan component may be configured in a first position within the fan housing, and in a second airflow state, the reconfigurable fan component may be configured in a second position within the fan housing. In some embodiments, a first airflow state may be associated with airflow in a first direction, and a second airflow state may be associated with airflow in a second direction. As the multi-directional fan 105 is reversible, the second position may generally correspond to a one-hundred-and-eighty-degree orientation with respect to the first position. When referring to a reversible fan that can rotate one-hundred-and-eighty-degrees, the axis being mentioned typically corresponds to the fan's central axis. In other words, the multi-directional fan 105 can be rotated along a central axis by one-hundred-and-eighty-degrees, allowing for a complete reversal of the airflow direction. Thus, the multi-directional fan 105 can be turned around, such that airflow is directed from the original position to the opposite direction. This reversible feature provides greater flexibility in controlling the airflow and allows the multi-directional fan 105 to adapt to different ventilation needs or specific applications.

Finally, in certain embodiments, the multi-directional fan 105 can be secured by engaging one or more of the plurality of securing components. It is contemplated that the configuration of the multi-directional fan 105 and the tray enclosure 120 will be such that the plurality of securing components will not need to be adjusted and can simply be disengaged and reengaged regardless of the orientation of the multi-directional fan 105 within the tray enclosure 120.

In more embodiments, a power cable 145 can be utilized to electrically couple the connector 140 with the multi-directional fan 105. In order to provide for multiple orientations of the multi-directional fan 105 within the tray enclosure 120, the power cable 145 can be designed to couple in a variety of ways. In some embodiments, the power cable 145 may include enough length or slack to facilitate any orientation of the multi-directional fan 105. In further embodiments, the multi-directional fan 105 may include a plurality of power coupling ports to allow the power cable 145 to connection upon any selected orientation. In still more embodiments, the power cable may be designed such that a contact connection is provided that allows for electrical coupling between one or more contacts on the multi-directional fan 105 and reciprocal contacts on the tray enclosure 120 which is fed power through the power cable 145.

Figure 2A:
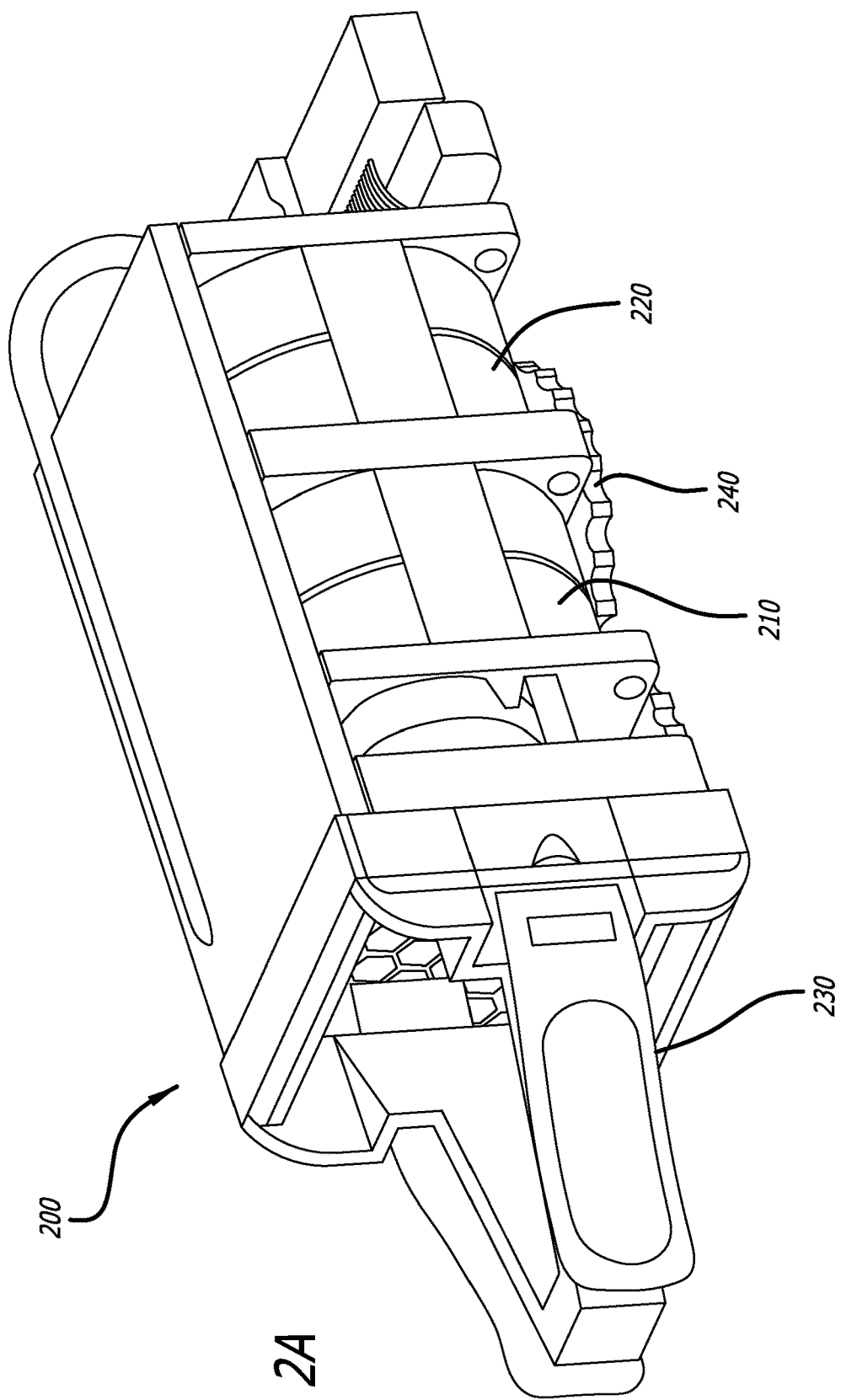
FIG. 2A provides a first perspective view of a conceptual schematic illustrating an automated bi-directional airflow fan system in accordance with various embodiments of the disclosure.
Figure 2B:
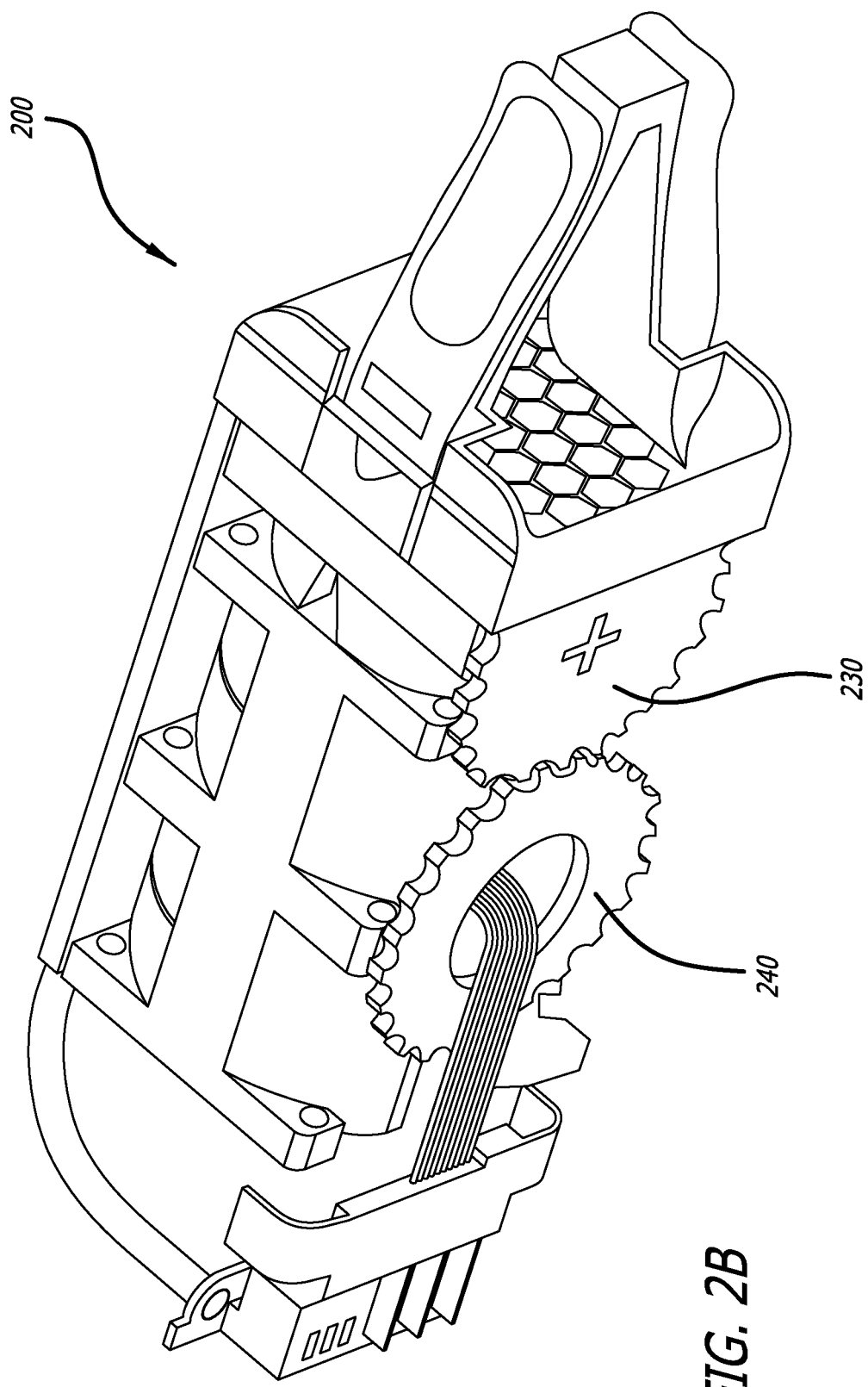
FIG. 2B provides a second perspective view of a conceptual schematic illustrating an automated bi-directional airflow fan system in accordance with various embodiments of the disclosure.

Referring to FIG. 2A, a first perspective view of a conceptual schematic illustrating an automated bi-directional fan system 200 in accordance with various embodiments of the disclosure is shown. While various embodiments described above with respect to FIG. 1 allow for the adjustment of orientation of the fans via a manual removal and insertion, various models or deployments of devices may not provide space or access to physically adjust the fans. In response, various embodiments, such as those depicted in FIGS. 2A and 2B, provide for an automatic, internal change in fan orientation, and thus airflow directional change.

In many embodiments, an automated bi-directional fan system 200 can include a plurality of internal fans. In the embodiment depicted in FIG. 2A, a first fan 210 and a second fan 220 are disposed within a housing that provides for airflow along an internal chamber. The automated bi-directional fan system 200 can be configured to be inserted within a variety of devices but may be remote or otherwise inaccessible to a user who may desire to change the airflow direction upon one or more conditions occurring.

Therefore, in several embodiments, a rotational gear can be physically coupled to each of the plurality of fans such that rotational changes in the position of the rotational gear translates to a rotational change in the position of the coupled fan. For example, in the embodiment depicted in FIG. 2A, the first fan 210 is coupled to a first rotational gear 230 while the second fan 220 is coupled to a second rotational gear 240. In various embodiments, the first rotational gear 230 and the second rotational gear 240 can be configured to themselves be coupled or otherwise interlocked with each other such that rotation of one gear will necessitate rotation in the other gear. In this way, a single servo, step motor, gear, or other translational mechanism needs to be rotated on demand to change the orientation of all fans within the automated bi-directional fan system 200.

For example, in the embodiment depicted on FIG. 2A, if the user desired to change the orientation of the fans from a PSI to a PSE direction, a step motor may be utilized to rotate the first rotational gear 230, which would direct a rotational change in the second rotational gear 240, thus changing the orientation of the first fan 210 which is coupled and a second fan 220 until they were in the desired position. As those skilled in the art will recognize, the number of fans and corresponding rotational gears can be varied based on the desired application. Single fan/gear designs can be operated similarly, as well as designs with more than two fan/gear pairs. Finally, in some embodiments, the fans may be mechanically coupled such that only a single rotational gear is required to move to change the direction of multiple fans within the automated bi-directional fan system 200.

Referring to FIG. 2B, a second perspective view of a conceptual schematic illustrating an automated bi-directional fan system 200 in accordance with various embodiments of the disclosure is shown. Similar to the embodiment depicted in FIG. 2A, the automated bi-directional fan system 200 includes a first rotational gear 230 and second rotational gear 240. However, to provide for power to deliver to the internal fans coupled to the rotational gears 230, 240, at least one gear can be configured in certain embodiments to have an internal gap or hole that can provide access for power cables to travel through.

Specifically, in the embodiment depicted in FIG. 2B, the second rotational gear is configured with a hole at the center sufficient to allow for the passage of power cables, or other items such as, but not limited to, cooling lines, sensors, etc. In various embodiments, the automated bi-directional fan system 200 will include a plurality of sensors or other devices that can be utilized to make changes within the fan orientation. For example, in some embodiments, a logic may be utilized to monitor various components of a device that utilizes the automated bi-directional fan system 200 via one or more sensors. Upon satisfying a predetermined set of conditions, the logic may direct the orientation of the fans to change.

As can also be seen in the embodiment depicted in FIG. 2B, the first rotational gear 230 includes an indent at the bottom center which can be configured to accept an interface which can facilitate rotation by a step motor or other translational machine. The first rotational gear 230 and second rotational gear 240 are also interconnected such that rotation of one gear will necessitate the rotation of the other gear. However, it is contemplated that other configurations may exist where two or more step motors or other translational devices can interface with the automated bi-directional fan system 200 to provide a more complex set of orientations and fan blowing directions based on the desired application.

Figure 3A:
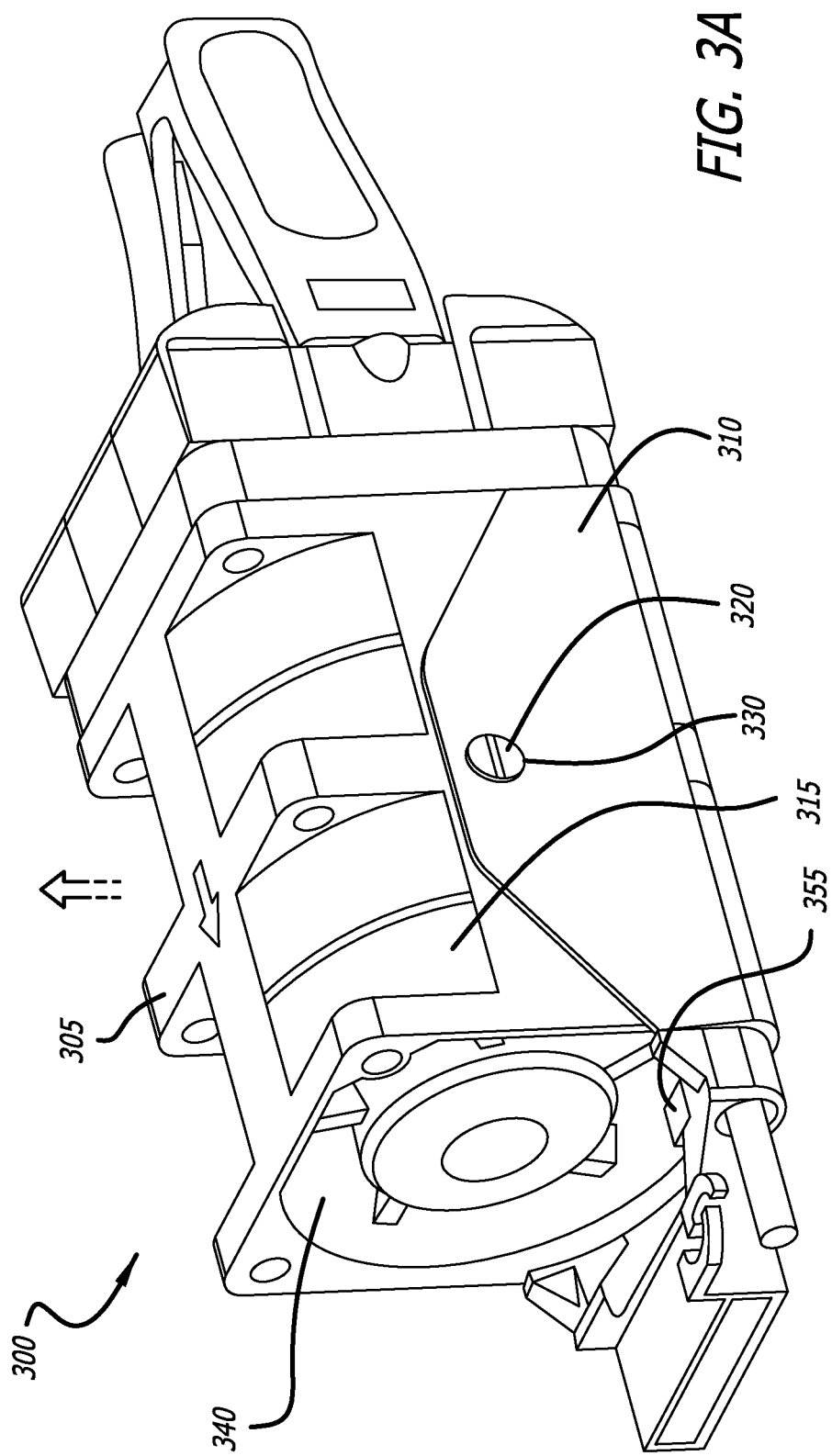
FIG. 3A provides a perspective view of a schematic illustrating a configurable bi-directional airflow system in a locked state having a first direction of airflow in accordance with various embodiments of the disclosure.

Referring to FIG. 3A, a perspective view of a schematic illustrating a configurable bi-directional airflow system in a locked state having a first direction of airflow in accordance with various embodiments of the disclosure is shown. In many embodiments, the reconfigurable fan component 305 may be configured to be housed within in a fan housing 310 wherein the fan housing 310 may be configured to have a plurality of walls that may wrap around or fit snugly with the reconfigurable fan component 305. In further embodiments, the reconfigurable fan component 305 may be configured with a first insertion nub 320 and a second insertion nub 325 (see FIG. 3C) that may be positioned on opposite sides of the reconfigurable fan component 305. In certain embodiments, the first insertion nub 320 may be configured to fit within a first locking engagement receptor 330 of the fan housing 310 and the second insertion nub 325 may be configured to fit within a second locking engagement receptor 335 and a first fan mating component 355 may be configured with a reconfigurable fan component 305 in a manner that enables engagement with a housing mating component 350 of the fan housing 310.

While not shown, those skilled in the art will recognize that the second locking engagement receptor 335 and other components described herein may be configured to be on the opposing side of the fan housing 310 such that a somewhat symmetrical configuration of engagement is achieved. Likewise, those skilled in the art will understand that the first and second engagement receptors 330, 335 as well as the first valley 326 and second valley (not shown) may be holes that are configured to receive one of the first and second insertion nubs 320, 325 concurrently. The first and second insertion nubs 320, 325 may be configured to be securing nubs, such as, but not limited to rubber nubs or stoppers that are configured to be a certain size as to secure the reconfigurable fan component 305 to the fan housing 310. However, the first and second insertion nubs 320, 325 may also be configured as a screw or other fastening device capable of engaging or otherwise utilizing an engagement receptor and valley to secure the reconfigurable fan component 305 to the fan housing 310 such that an attached state is achieved.

Either of the fan mating components 355 or 360 can include mating features that securely fasten the fan to the equipment housing, ensuring a tight fit and preventing any unintended movement. Alternatively, the fan mating components 355 or 360 may consist of a series of grooves or ridges that interlock with corresponding features on the fan housing 310, for example, by providing a stable and reliable connection. Other possibilities for the fan mating components 355 or 360 could include screw holes for screw-based attachment, magnetized surfaces for easy installation, and/or specialized connectors for plug-and-play functionality. It is envisioned that these options for the fan mating components 355 or 360 enhance the versatility of the bi-directional fan system 300, allowing for seamless integration into different equipment configurations while maintaining optimal airflow in either direction.

It should be appreciated that by providing a pair of insertion nubs 320, 325 on mirrored or opposing locations on the sides of a fan housing 310 offers significant benefits with respect to the bi-directional fan system 300. For example, in some embodiments, the pair of insertion nubs 320, 325 serve as a versatile mechanism that ensures that the bi-directional fan system 300 remains securely attached to its housing, regardless of its rotational direction. When the fan is installed in one direction, one or more insertion nubs 320, 325 on a particular side are configured to engage and lock the bi-directional fan system 300 in place, thereby providing stability during operation. Similarly, when the bi-directional fan system 300 is reversed and installed in the opposite direction, one or more insertion nubs 320, 325 on the mirrored side perform the same function, ensuring a secure fit and preventing any unwanted movement or detachment. This symmetrical configuration allows for seamless reversibility of the bi-directional fan system 300, offering convenience and flexibility in various applications where bidirectional airflow is required.

In some embodiments, either or both of the first insertion nub 320 and the second insertion nub 325 may be formed in an annular configuration comprising a diameter. It should be appreciated, however, that either or both of the first insertion nub 320 and the second insertion nub 325 may be formed in any shape, and of any material, without limitation. As shown, the first insertion nub 320 and the second insertion nub 325 may have a corresponding first valley 326 and second valley (not shown) formed therebetween. In some embodiments, the insertion nub 320 may be a singular feature, without a valley.

To that end, either or both of the first insertion nub 320 and the second insertion nub 325 may be configured for insertion in one or more receiving orifices, such as locking engagement receptor 330. There is flexibility in terms of materials and shapes without any specific limitations. This allows for the customization and adaptation of the nubs 320, 325 based on specific requirements.

In general, the nubs are configured to provide a secure locking fit when inserted into the receiving orifice such as locking engagement receptor 330 of the fan housing 310. This may be achieved by considering a combination of factors such as shape, dimensions, and material properties. For example, the nubs 320, 325 may be formed from various materials, including plastic, metal, or rubber, without limitation. It should be appreciated that each of the forgoing materials offers unique characteristics such as durability, flexibility, or vibration dampening. Additionally, the nub's shapes may vary, ranging from cylindrical, conical, or even featuring grooves or protrusions, ensuring a snug fit, and preventing unwanted movement or dislodgment. This versatility in material and shape options enables the nub to effectively secure the fan housing, promoting stability and reliable operation within the desired system or equipment.

In further embodiments, the reconfigurable fan component 305 may be configured to be detachable from the fan housing 310 by disengaging the first insertion nub 320 and the second insertion nub 325 of the reconfigurable fan component 305 from the respective first locking engagement receptor 330 and second locking engagement receptor 335 of the fan housing 310. Additionally, in certain embodiments, the reconfigurable fan component 305 may configured to be rotationally reconfigured upon a horizontal access when detached from the fan housing 310 and reinserted into the fan housing 310 after a one hundred and eighty degree rotation so that the first fan opening 340 and the second fan opening 345 of the reconfigurable fan component 305 are each respectively positioned on opposite ends of to the fan housing 310 when reinserted into the fan housing and wherein upon such rotation and reinsertion of the reconfigurable fan component 305 into the fan housing 310 the first insertion nub 320 may be engaged and locked into the second locking engagement receptor 335 and the second insertion nub 325 may be engaged and locked into the first locking engagement receptor 330 to secure the reconfigurable fan component 305 into the fan housing 310 and wherein the second fan mating component 360 may be engaged with the housing mating component 350.

A direction indicator 328 may be disposed on one more surfaces of the bi-directional fan system 300 to visually depict or otherwise indicate an airflow direction. It should be appreciated that the direction indicator 328 provides a quick and intuitive visual cue for users to easily identify the path of airflow with respect to the device. This greatly assists in proper installation and maintenance of the equipment, ensuring optimal cooling and ventilation for reliable operation of various systems, without limitation. In some embodiments, the direction indicator may be attached to the bi-directional fan system 300 or otherwise formed or molded singularly of the same material.

Figure 3B:
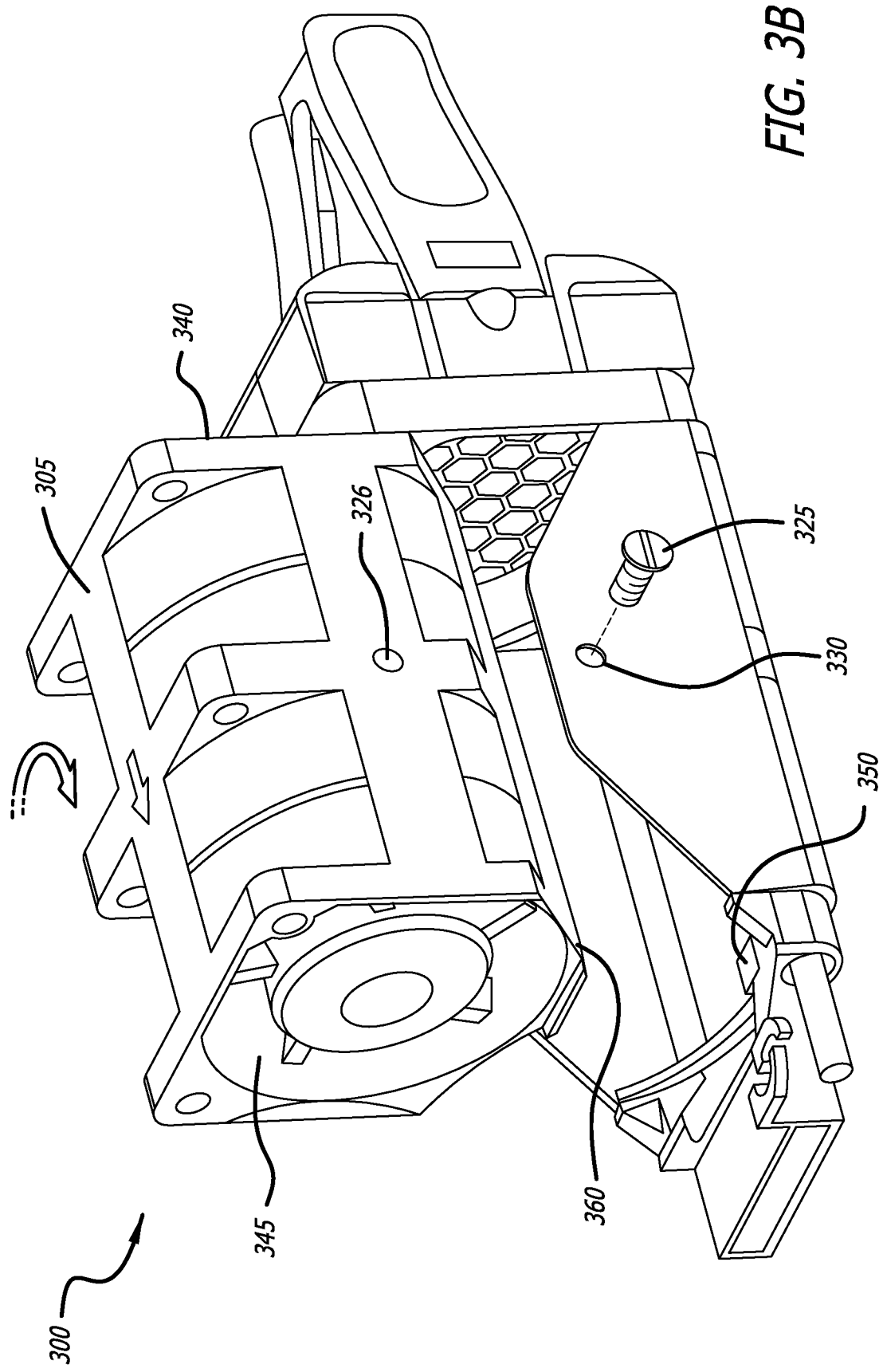
FIG. 3B provides a perspective view of a schematic illustrating a configurable bi-directional airflow system in a detached state for reconfiguration in accordance with various embodiments of the disclosure.

Referring to FIG. 3B a perspective view of a schematic illustrating a configurable bi-directional airflow system in a detached state for reconfiguration in accordance with various embodiments of the disclosure is shown. In several embodiments, as is shown in FIG. 3B, the reconfigurable fan component 305 may be configured to be detached from the fan housing 310 to be in a detached state wherein such reconfigurable fan component 305 may be easily rotated and reattached to redirect the airflow of the bi-directional fan system 300 in the opposite direction. The easily removable nature of the reconfigurable fan component 305 from the fan housing 310 makes it not only easy to change the direction of the airflow, but also, may be useful to remove the reconfigurable fan component 305 for cleaning purposes or replacement without disassembly of several complex components, but rather, by creating a simple reconfigurable fan component 305 that has the ability to easily detach, rotate, clean, or replace and reattach without additional components or machinery, the bi-directional fan system 300 reduces costs so additional or redundant components do not need to be integrated and eliminates unnecessary down time in systems such as data center switches that require bi-directional airflow.

Figure 3C:
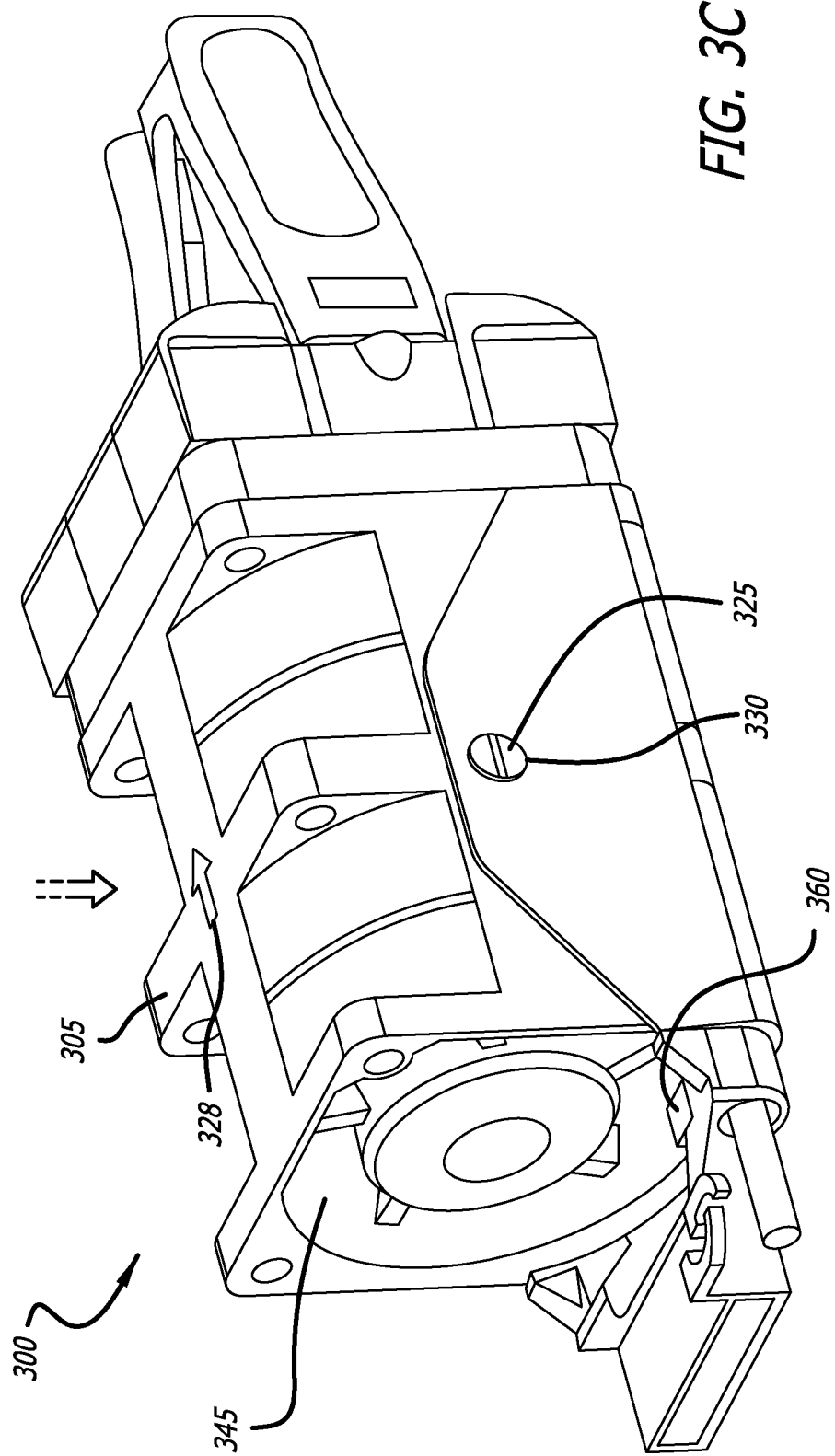
FIG. 3C provides a perspective view of a schematic illustrating a configurable bi-directional airflow system having a second direction of airflow in a locked state in accordance with various embodiments of the disclosure.

Referring to FIG. 3C a perspective view of a schematic illustrating a configurable bi-directional airflow system having a second direction of airflow in a locked state in accordance with various embodiments of the disclosure is shown. In additional embodiments, the reconfigurable fan component 305 may be configured to be easily re-attachable to the fan housing 310 through downward pressure wherein the first insertion nub 320 and second insertion nub 325 of the reconfigurable fan component 305 engage with the second locking engagement receptor 335 and the first locking engagement receptor 330 respectively to snap or otherwise lock into place without complex tools (or any tools) or assembly. In further embodiments, once the reconfigurable fan component 305 is snapped into place with the fan housing 310 the airflow may continue in the intended direction and will remain in place without further securing mechanisms such as screws or other hardware reassembling tools.

Although a specific embodiment for a bi-directional fan system 300 comprising a reconfigurable fan component 305 and corresponding fan housing 310 that may be suitable for carrying out the various steps, processes, methods, and operations described herein is discussed with respect to FIG. 3A, any of a variety of systems and/or processes may be utilized in accordance with embodiments of the disclosure.

For example, the first insertion nub 320 and second insertion nub 325 of the reconfigurable fan component 305 and its ability to easily be removed from the fan housing 310 for rotation and redirection of airflow. The elements depicted in FIGS. 3A-3C may also be interchangeable with other elements of FIGS. 4A-4F, 5A-5C, and 6A-6B as required to realize a particularly desired embodiment.

Figure 4A:
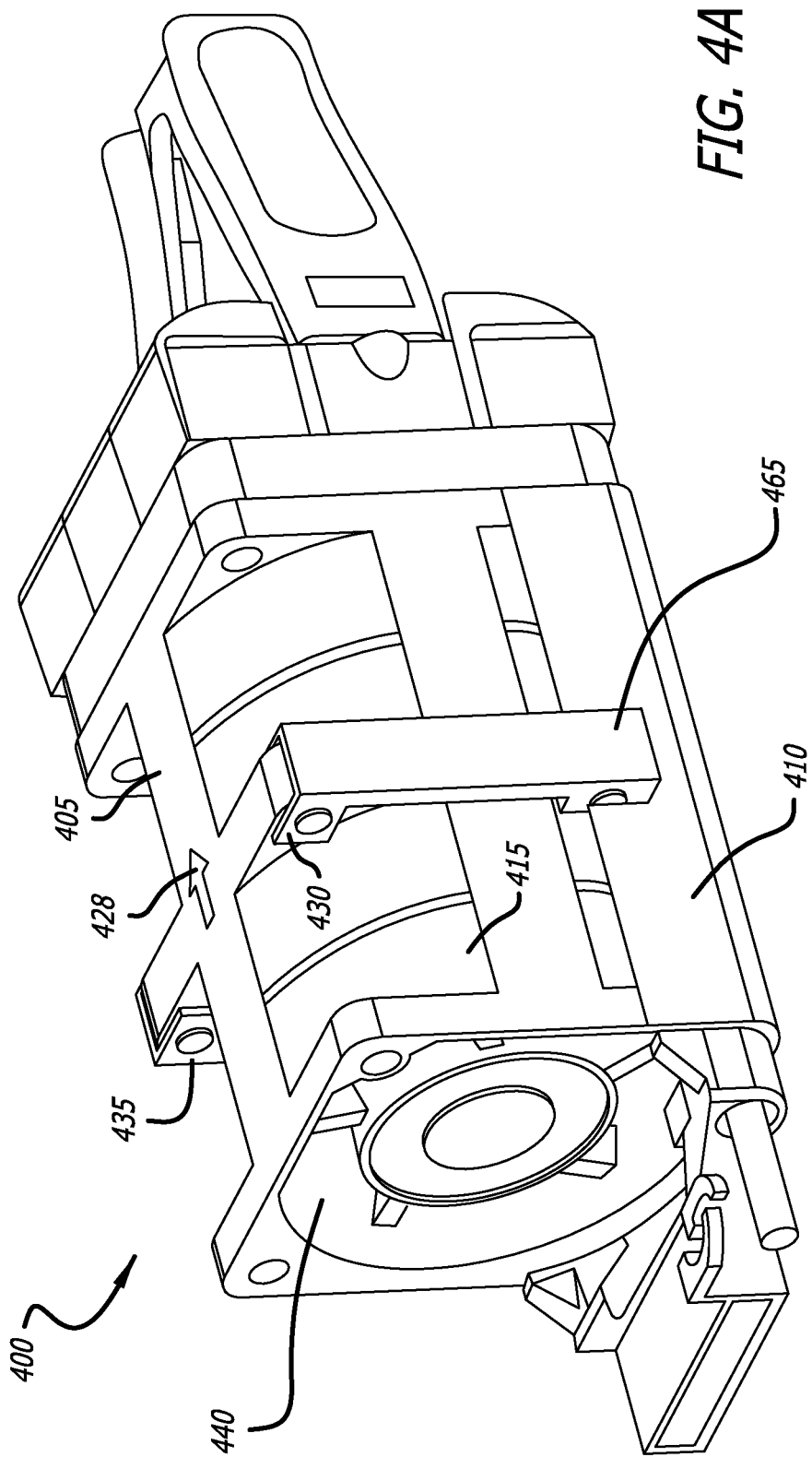
FIG. 4A provides a perspective view of a schematic illustrating a configurable bi-directional airflow system in a locked state having a first direction of airflow in accordance with various embodiments of the disclosure.

Referring to FIG. 4A a perspective view of a schematic illustrating a configurable bi-directional airflow system in a locked state having a first direction of airflow in accordance with various embodiments of the disclosure is shown. In some embodiments, the bi-directional fan system 400 may comprise a reconfigurable fan component 405, a fan housing 410, a plurality of fans 415, a first through hole 420, a second through hole 425, a first locking engagement component 430, a second locking engagement component 435, a first fan opening 440, a second fan opening 445, a housing mating component 450, a first fan mating component 455, a second fan mating component 460, a hinged securing member 465, a padded component 470, and a snap fit component 475.

In additional embodiments, the fan housing 410 may be configured in a manner wherein it may receive the reconfigurable fan component 405 to fit securely within the interior of the fan housing 410 wherein the fan housing 410 may have a base and multiple sides that may be configured to wrap partially wrap around the exterior of the reconfigurable fan component 405 and wherein such portions of the fan housing 410 that wraps around the reconfigurable fan component 405 may vary in height depending on the various embodiments, including, without limitation, the various mechanisms that may lock the reconfigurable fan component 405 in place in connection with the reconfigurable fan component 405, such as, for example, the hinged securing member 465 may be attached to an edge of the fan housing 410 to rotate upon an axis at or near the point of connection with the fan housing 410 wherein the hinged securing member 465 may be configured to be a connecting member that secures the reconfigurable fan component 405 in place with the fan housing 410.

It should be appreciated that by providing a pair of hinged securing members 465 on mirrored or opposing locations on the sides of a fan housing 410 offers significant benefits with respect to the bi-directional fan system 400. For example, in some embodiments, the hinged securing members 465 serve as a versatile locking mechanism that ensures that the bi-directional fan system 400 remains securely attached to its housing, regardless of its rotational direction. When the fan is installed in one direction, one or more hinged securing members 465 on a particular side are configured to engage and lock the bi-directional fan system 400 in place, thereby providing stability during operation. Similarly, when the bi-directional fan system 400 is reversed and installed in the opposite direction, one or more hinged securing members 465 on the mirrored side perform the same function, ensuring a secure fit and preventing any unwanted movement or detachment. This symmetrical configuration allows for seamless reversibility of the bi-directional fan system 400, offering convenience and flexibility in various applications where bidirectional airflow is required.

In still more embodiments, he first through first through hole 420 and second through hole 425 may protrude all the way through a portion of the fan housing molding and may also be, for example, a blind hole wherein the hole does not go all the way through the, a stepped hole wherein the hole may have different diameters on either end of the hole, a counterbore wherein the hole may have a larger opening than internal diameter, or a countersink shape wherein the hole may be conical in shape. In further embodiments the first through first through hole 420.

In more embodiments, the first locking engagement component 430 and second locking engagement component 435 may be pronged in shape wherein each such prong may have a rubber nub that may be configured to each fit with or be secured in its respective first through first through hole 420 or second through hole 425. In additional embodiments, the first locking engagement component 430 may be a solid structure having two prongs with a protrusion on the inside of each prong that may fit into a corresponding first through hole 420 or second through hole 425. In some embodiments, the first locking engagement component 430 and second locking engagement component 435 may be made of multiple components including, for example, rubber nubs that may be secured to one or more prongs or protrusions that may be configured to secure the reconfigurable fan component 405 in place by connecting with the first through hole 420 or second through hole 425.

In a number of embodiments, a plurality of fan openings such as, for example, the first fan opening 440 and second fan opening 445 depicted in FIGS. 4A through 4E. In numerous embodiments, a first fan opening 440 and second fan opening 445 may each be configured to direct air in a specific direction which may be used to assist the reconfigurable fan component 405 in redirecting air in an opposite direction when the reconfigurable fan component 405 is reconfigured to reverse the ends of the reconfigurable fan component 405 in a manner that the first fan opening 440 may be placed in the position wherein the second fan opening 445 had been positioned prior to rotation of the reconfigurable fan component 405 in comparison to the relative position of the fan housing 410.

In some embodiments the snap fit component 475 may be configured to attach the hinged securing member 465 to the fan housing 410 in a manner that provides the ability of the hinged securing member 465 to rotate upon an axis parallel to the edge of the fan housing 410 so the hinged securing member 465 may achieve an attached state wherein the hinged securing member 465 may be attached to the first through hole 420 of the fan housing 410. In further embodiments, the reconfigurable fan component 405 may be configured to fit within a first locking engagement component 430 of the fan housing 410 and the second through hole 425 is configured to fit within a second locking engagement component 435 and a first fan mating component 455 is configured on the reconfigurable fan component 405 to be engaged with a housing mating component 450 of the fan housing 410.

Figure 4B:
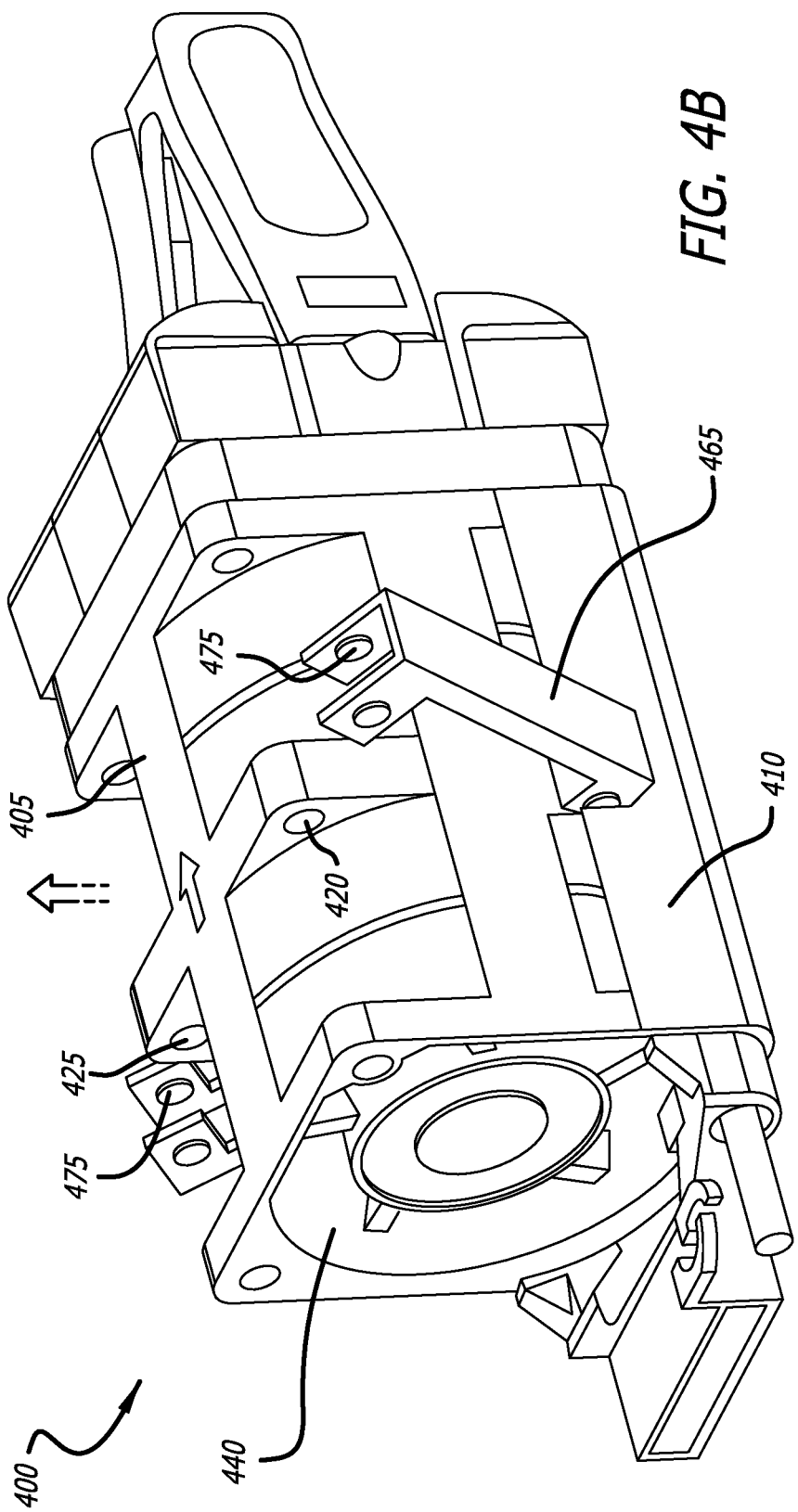
FIG. 4B provides a perspective view of a schematic illustrating a configurable bi-directional airflow system having a first direction of airflow in an unlocked state in accordance with various embodiments of the disclosure.

Referring to FIG. 4B a perspective view of a schematic illustrating a configurable bi-directional airflow system having a first direction of airflow in an unlocked state in accordance with various embodiments of the disclosure is shown.

In many embodiments, as may be depicted in FIG. 4B, the fan housing 410 may have a housing mating component 450 configured to accept a mating component of the reconfigurable fan component 405. In further embodiments, the reconfigurable fan component 405 may have multiple mating components on either end of the reconfigurable fan component 405 configured in a manner that when the reconfigurable fan component 405 and the fan housing 410 are connected the housing mating component 450 and one of such mating components of the reconfigurable fan component 405 align and connect with each other. In additional embodiments, the reconfigurable fan component 405 may be configured with a first fan mating component 455 (as shown in FIG. 4C) and a second fan mating component (see also second fan mating component 660 of FIG. 6B) wherein such mating components may each be on opposite ends of the reconfigurable fan component 405 and configured to provide a connection between the reconfigurable fan component 405 and the fan housing 410 whether the bi-directional fan system 400 may be set up to direct air inward or outward based on the rotational position of the reconfigurable fan component 405 in comparison to the fan housing 410.

Figure 4C:
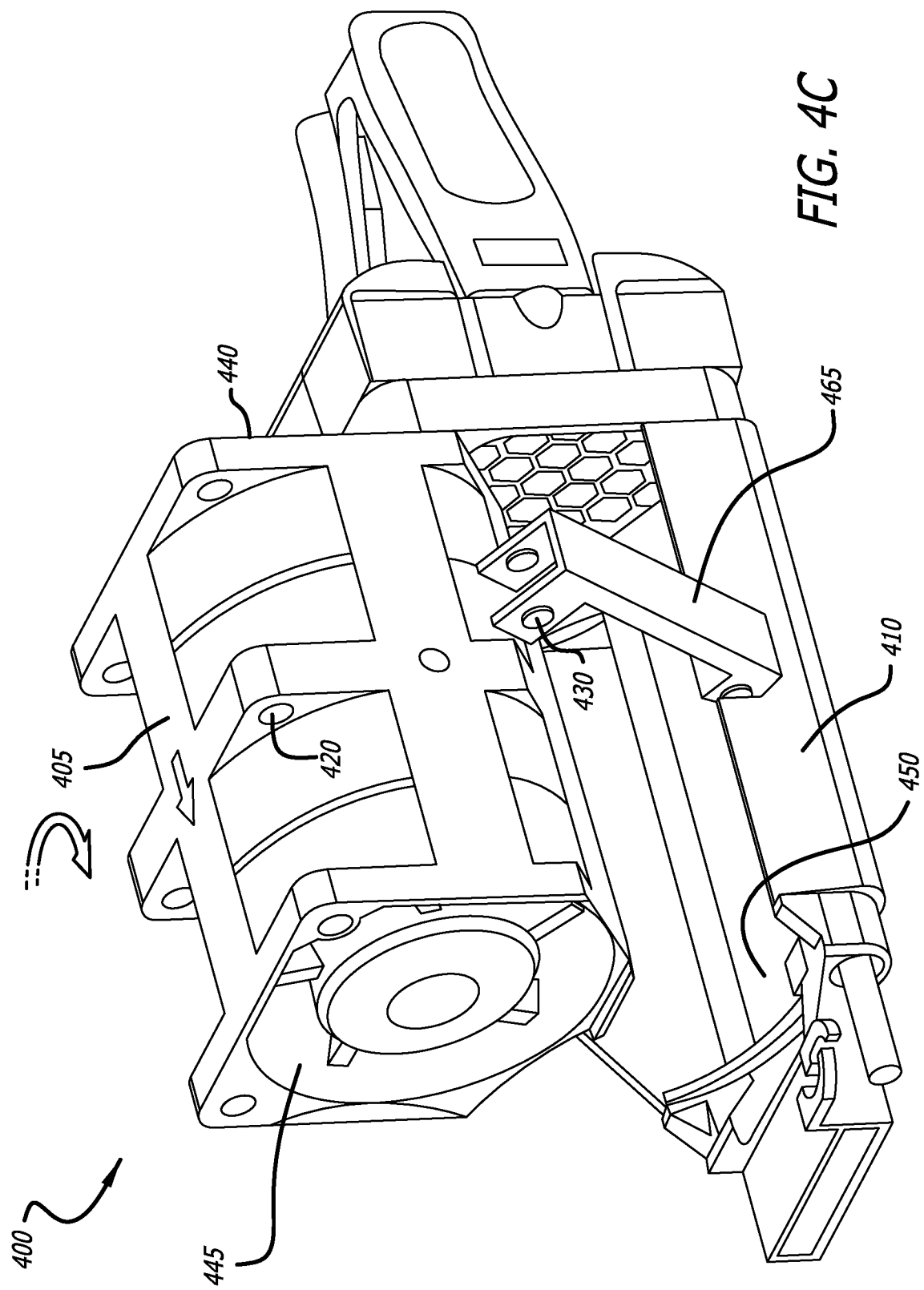
FIG. 4C provides a perspective view of a schematic illustrating a configurable bi-directional airflow system in a detached state for reconfiguration in accordance with various embodiments of the disclosure.

Referring to FIG. 4C a perspective view of a schematic illustrating a configurable bi-directional airflow system in a detached state for reconfiguration in accordance with various embodiments of the disclosure is shown. In further embodiments, as shown in FIG. 4C, the reconfigurable fan component 405 may be detachable from the fan housing 410 in a manner that enables the reconfigurable fan component 405 to be reconfigured by, for example rotating the reconfigurable fan component 405 to change the direction that air would flow through the reconfigurable fan component 405, replacing the reconfigurable fan component 405, or cleaning the fan housing 410 and reconfigurable fan component 405 before re-engaging the reconfigurable fan component 405 with the fan housing 410 in an attached state.

Figure 4D:
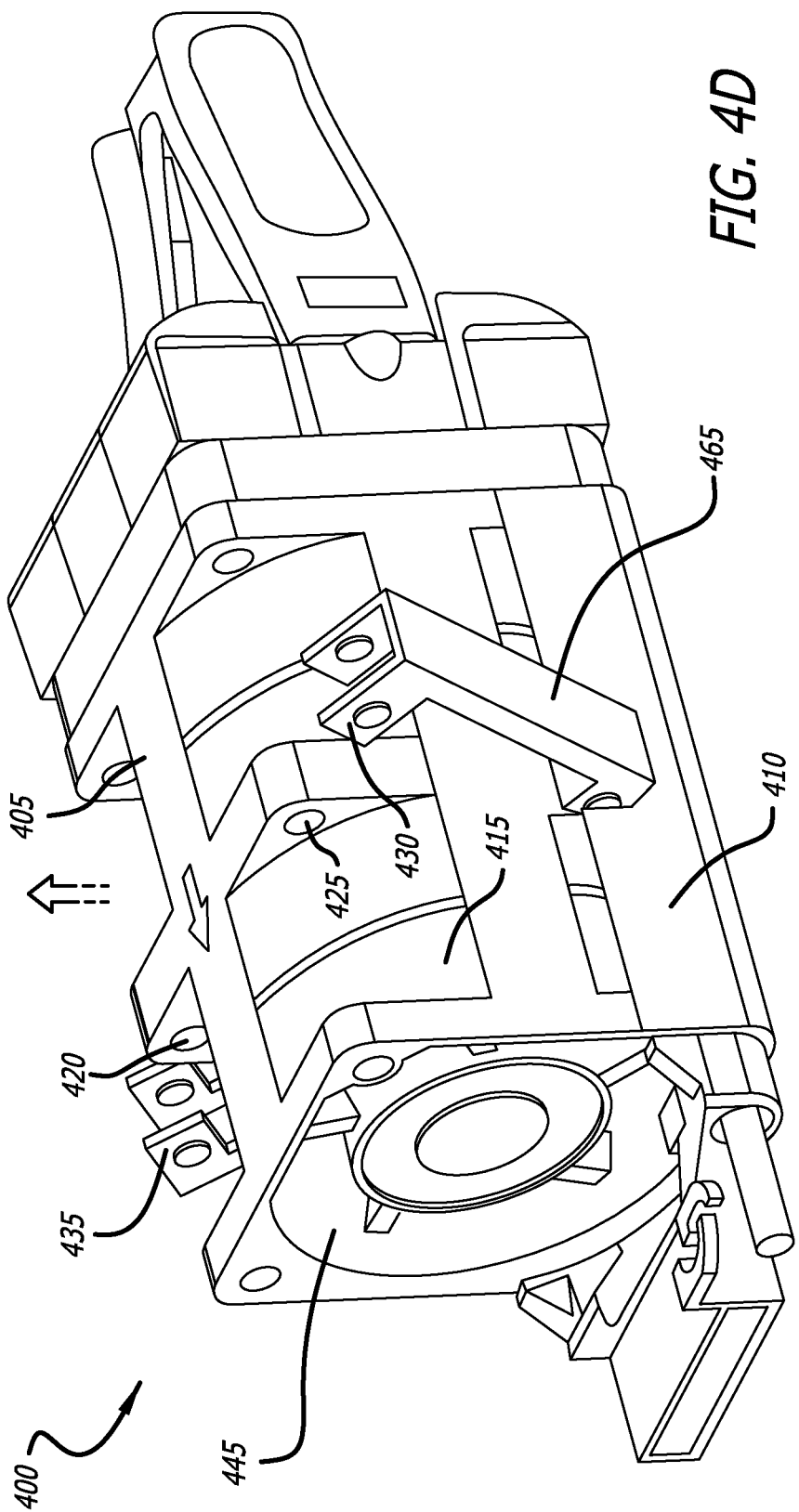
FIG. 4D provides a perspective view of a schematic illustrating a configurable bi-directional airflow system having a second direction of airflow in an unlocked state in accordance with various embodiments of the disclosure.

Referring to FIG. 4D a perspective view of a schematic illustrating a configurable bi-directional airflow system having a second direction of airflow in an unlocked state in accordance with various embodiments of the disclosure is shown. In certain embodiments, as is shown in FIG. 4D, the reconfigurable fan component 405 may be reinserted into the fan housing 410 in the desired position wherein such configuration would be in a position to provide airflow in a desired direction as may be needed by the system that the bi-directional fan system 400 is installed.

Figure 4E:
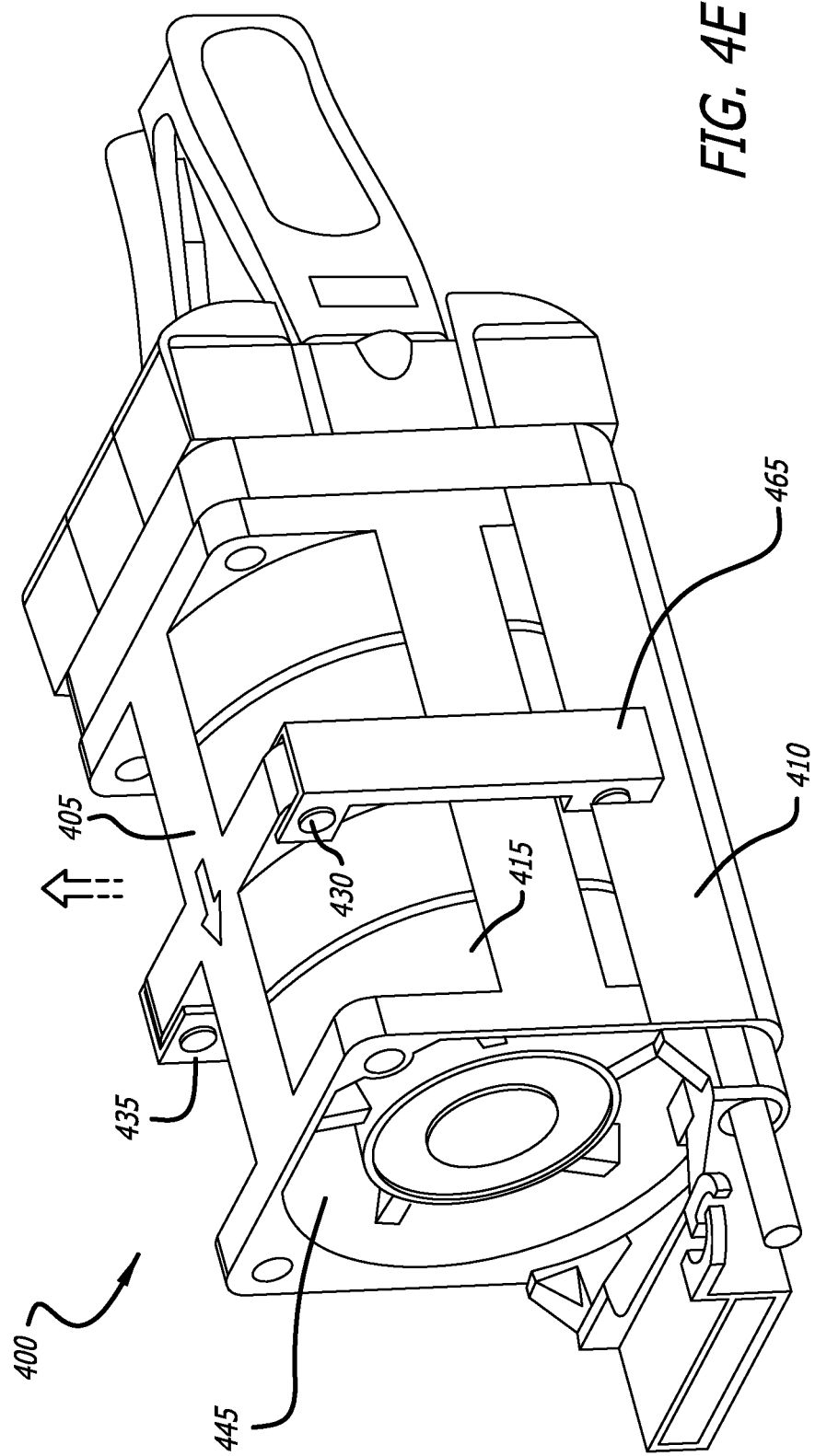
FIG. 4E provides a perspective view of a schematic illustrating a configurable bi-directional airflow system having a second direction of airflow in a locked state in accordance with various embodiments of the disclosure.

Referring to FIG. 4E a perspective view of a schematic illustrating a configurable bi-directional airflow system having a second direction of airflow in a locked state in accordance with various embodiments of the disclosure is shown. In a number of embodiments, as is shown in FIG. 4E, the reconfigurable fan component 405 may be snapped into place to secure the reconfigurable fan component 405 within the fan housing 410 to prevent any movement or vibration related issues. In a variety of embodiments, the bi-directional fan system 400 may be configured in a manner wherein application of pressure upon the reconfigurable fan component 405 into the fan housing 410 will cause the hinged securing member 465 to rotate upon an axis parallel to an edge of the fan housing 410 to move first locking engagement component 430 and second locking engagement component 435 of each hinged securing member 465 to engage and interlock with the respective first through hole 420 and second through hole 425 to lock the reconfigurable fan component 405 and fan housing 410 together.

Referring to FIG. 4F a perspective view of a locking mechanism as depicted in accordance with various embodiments of the disclosure is shown. In many embodiments, the first locking engagement component 430 and second locking engagement component 435 may be configured to utilize rubber nubs that may assist with securing the reconfigurable fan component 405 in place in connection with the fan housing 410 without vibration or other movements that may cause damage to the system and components thereof.

In some embodiments, the hinged securing member 465 may comprise a generally elongate member 468 that couples with a top of the bi-directional fan system 400. It should be appreciated, however, that the hinged securing member 465 may be formed in any of various shapes, depending on the fan or component with which it is coupling. Notably, even when the hinged securing member 465 is in locking engagement with the bi-directional fan system 400, a direction indicator 428 is still visible to the user. This greatly assists in proper installation and maintenance of the equipment, ensuring optimal cooling and ventilation for reliable operation of various systems, without limitation. In some embodiments, the direction indicator may be attached to the bi-directional fan system 300 or otherwise formed or molded singularly of the same material.

In certain embodiments, the hinged securing member 465 may have a padded component 470 fixed upon an inner edge of the hinged securing member 465 wherein the padded component 470 may be configured to hold the reconfigurable fan component 405 in place without any vibration or other movements while also not damaging the reconfigurable fan component 405. In some embodiments, the padded component 470 and the nubs of the first locking engagement component 430 and second locking engagement component 435 may be made of, for example, rubber, silicone, foam, neoprene, cork, textured surfaces, or other anti-slip or slip-resistant materials wherein such materials may be designed to prevent slipping, sliding, vibration or other movements that may be important for securing components in place.

In some embodiments, one or more surfaces of the hinged securing member 465 may incorporate various surface features 472 to enhance functionality such as locking and promote fixation with respect to the bi-directional fan system 400. For example, one or more ridges may be strategically placed along the inner surface of the hinged securing member 465, thereby providing increased grip and friction to prevent the fan from slipping or shifting during operation. Similarly, one or more latches, may be configured to promote locking, by ensuring a secure and stable attachment of the fan with respect to the engagement mechanism. It should be appreciated that such surface features 472 may be used alone or in combination, and without limitation depending on the surface they will ultimately encounter, so as to optimize the fan's stability, minimizing vibrations and/or ensuring reliable performance of the equipment.

In a variety of embodiments, the snap fit component 475 may be configured to attach the hinged securing member 465 to the fan housing 410 in a manner that provides the ability of the hinged securing member 465 to rotate upon an axis parallel to the edge of the fan housing 410 so the hinged securing member 465 may achieve an attached state wherein the hinged securing member 465 may be attached to the first through hole 420 of the fan housing 410.

Although a specific embodiment for a bi-directional fan system 400 comprising a reconfigurable fan component 405 and corresponding fan housing 410 that may be suitable for carrying out the various steps, processes, methods, and operations described herein is discussed with respect to FIGS. 4A-4F, any of a variety of systems and/or processes may be utilized in accordance with embodiments of the disclosure. For example, reconfigurable fan component 405 may be easily removed and rotated and re-attached to the fan housing 410 by simply applying downward pressure to the reconfigurable fan component 405 when aligned with the opening of the fan housing 410 causing it to lock in place in a manner that does not require additional tools (or any tools) or assembly and is positioned to prevent vibration or related movement issues. The elements depicted in FIGS. 4A-4F may also be interchangeable with other elements of FIGS. 3A-4C, 5A-5C, and 6A-6B as required to realize a particularly desired embodiment.

Figure 5A:
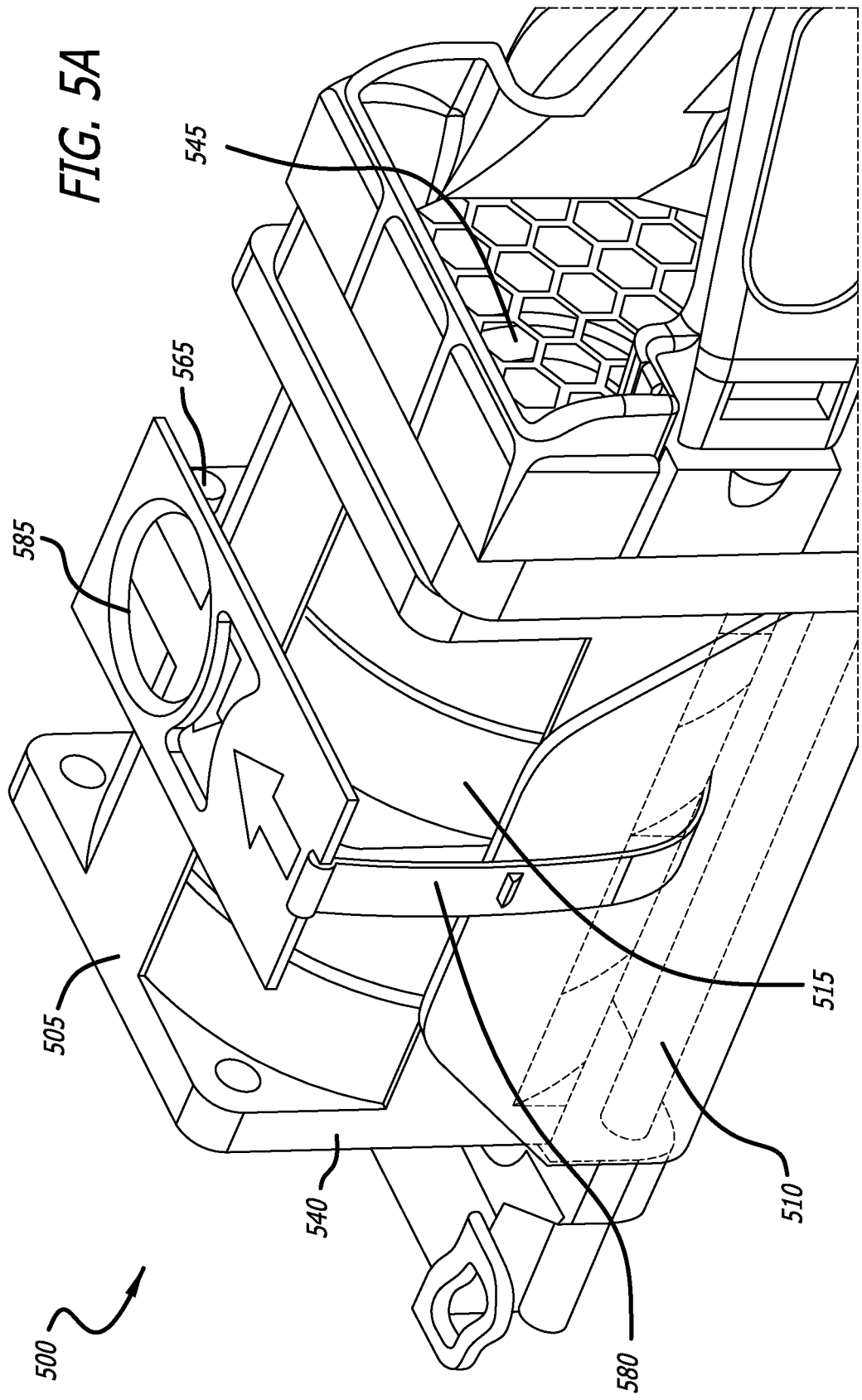
FIG. 5A provides a perspective view of a schematic illustrating a configurable bi-directional airflow system in a locked state having a certain direction of airflow in accordance with various embodiments of the disclosure.
Figure 5B:
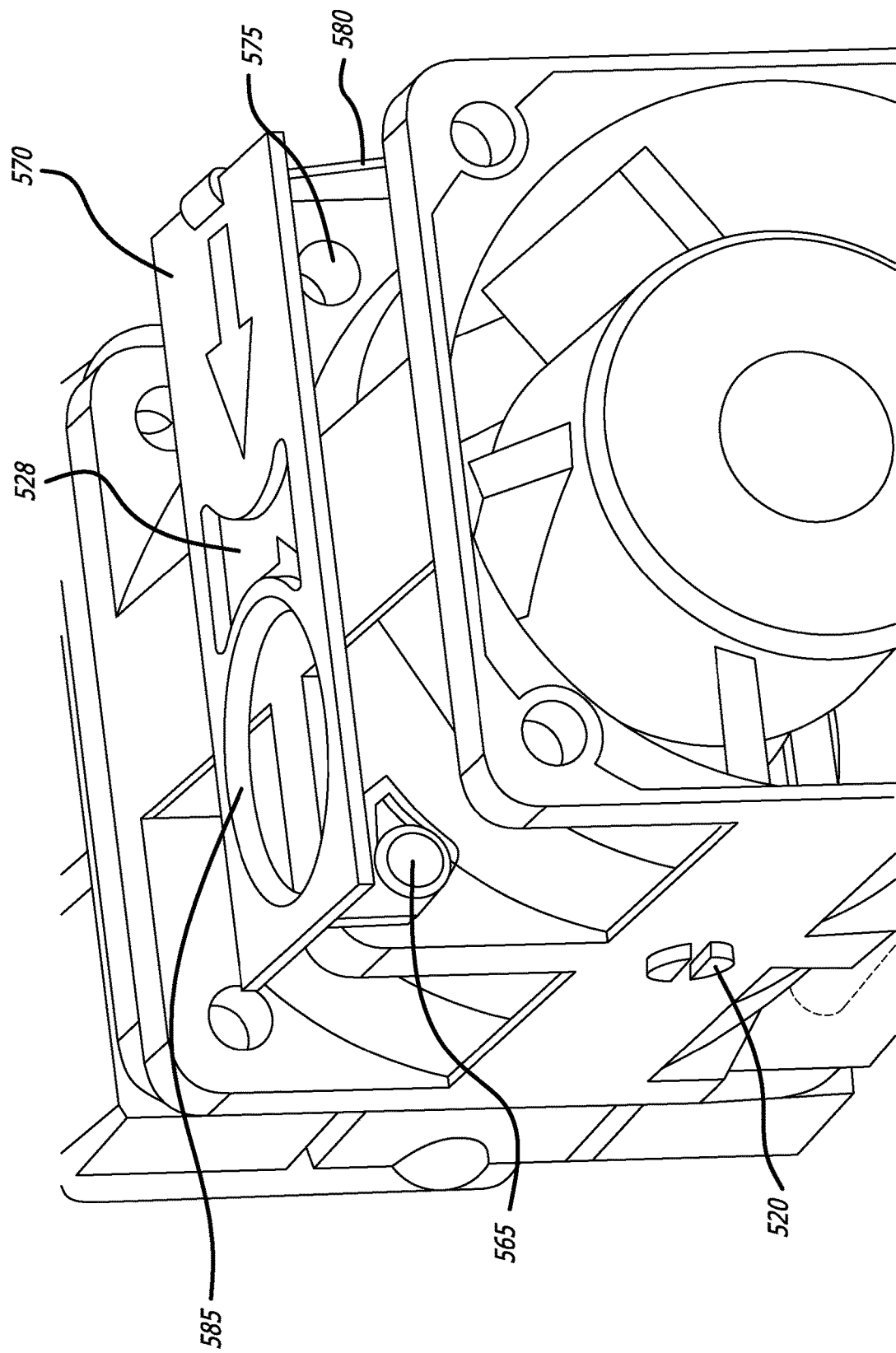
FIG. 5B provides a perspective view of a schematic illustrating a configurable bi-directional airflow system in a locked state having a certain direction of airflow in accordance with various embodiments of the disclosure.

Referring to FIGS. 5A and 5B, each a perspective view of a schematic illustrating a configurable bi-directional airflow system in a locked state (or attached state) having a certain direction of airflow in accordance with various embodiments of the disclosure is shown. In some embodiments, as may be shown in FIG. 5A, the bi-directional fan system 500 may be configured to comprise a reconfigurable fan component 505, a fan housing 510, a plurality of fans 515, one or more side tabs 520, a first through hole (not shown), a second through hole 575, a first fan opening 540, a second fan opening 545, pin component 565, a securing tab 570, a hinged member 580, a direction indicator 528, and one or more openings 585 of the securing tab 570.

In many embodiments, the reconfigurable fan component 505 may be configured to be housed in the fan housing 510 and may be secured in the fan housing 510 by a hinged member 580 that may be attached to a wall of the fan housing 510 and wrap around one side of the reconfigurable fan component 505 extending to an upper portion of the reconfigurable fan component 505 wherein the hinged member 580 may be connected with a securing tab 570 via a hinge that may enable the securing tab 570 to further wrap around a second portion of the reconfigurable fan component 505. In still more embodiments, the securing tab 570 may be configured with a pin component 565 that may also be configured to engage with a through hole of the reconfigurable fan component 505 in a manner that secures the reconfigurable fan component 505 in place with the fan housing 510.

Figure 5C:
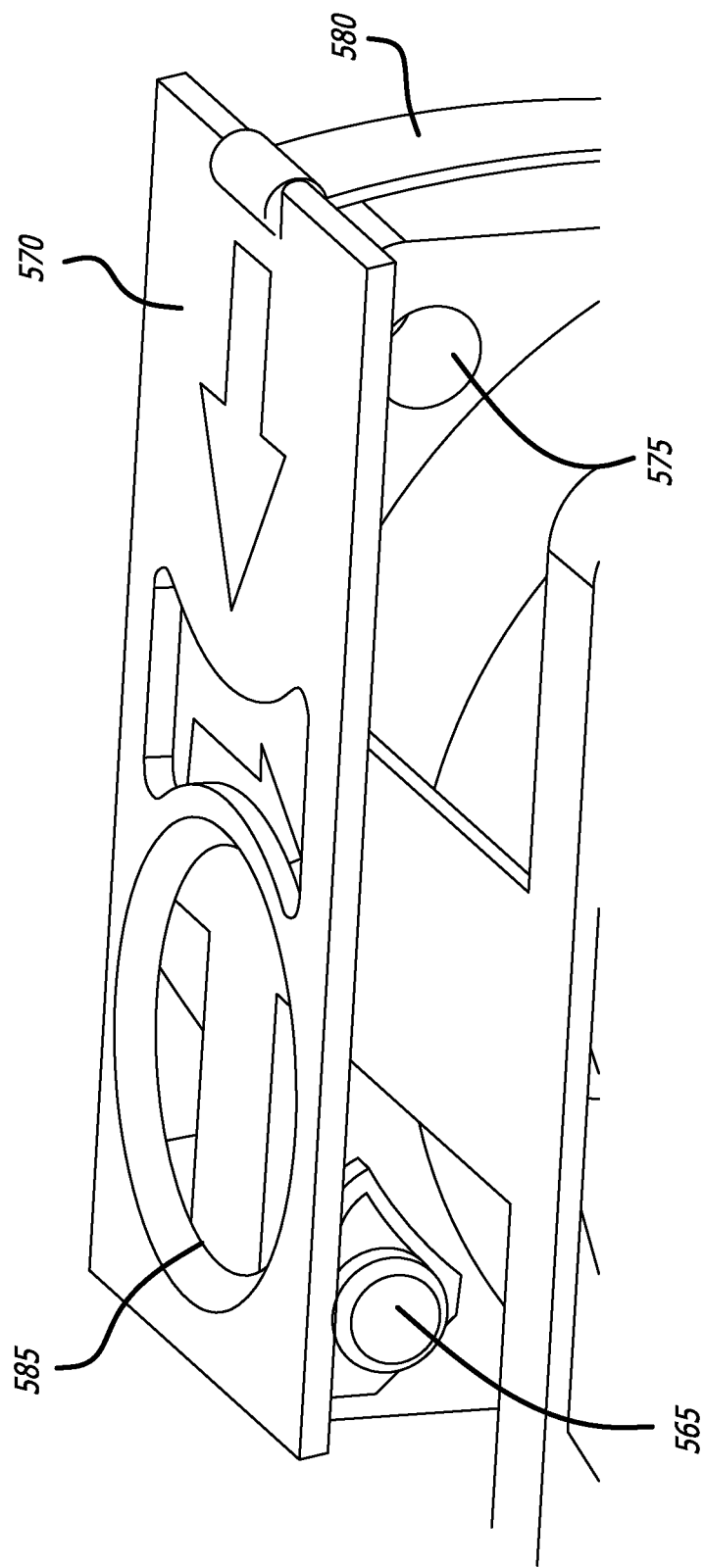
FIG. 5C provides a close-up perspective view of a locking mechanism of a configurable bi-directional airflow system in accordance with various embodiments of the disclosure.

Although, the second through hole 575 is not utilized in the embodiment depicted in FIGS. 5A-5C, additional embodiments may utilize any through hole to engage or otherwise secure the securing tab 570. As those skilled in the art will recognize, the second through hole 575 may be symmetrical with the first through hole (not shown) such that the pin component 565 is engaged with the securing tab 570 through the first through hole (not shown). The first through hole (not shown) may be configured to engage with the pin component 565 through a securing nub or via other means such as a screw, clip, or other typical fastener.

In some additional embodiments, the pin component 565 may be a nub, protrusion, spring, or any other mechanism configured to engage with and interlock with the through hole of the reconfigurable fan component 505. In further embodiments, the through hole may be a hole or various other mating recesses that may fit with the pin component 565 to secure the reconfigurable fan component 505 to the fan housing 510, that may be, for example, interconnected with the securing tab 570, hinged member 580, and a wall of the fan housing 510.

In several embodiments, the reconfigurable fan component 505 may be inserted and flush with an inner wall of the fan housing 510 in a manner that provides counter-pressure to the tension established by the securing tab 570 and hinged member 580 being wrapped around the reconfigurable fan component 505 and secured with the pin component 565 to the through hole of the reconfigurable fan component 505. Such counter-pressure against the tension holds the reconfigurable fan component 505 in place with the fan housing 510 in a manner that prevents any movement or vibration and related issues.

In more embodiments, the reconfigurable fan component 505 may be removed, rotated, cleaned, or replaced, and then be reinserted into the fan housing 510. In further embodiments, such reinsertion of the reconfigurable fan component 505 into the fan housing 510 may be secured by pulling the securing tab 570 up and over the reconfigurable fan component 505 by using the one or more openings 585 of the securing tab 570 so that the pin component 565 may engage with the through hole to lock the reconfigurable fan component 505 in place with the fan housing 510.

As shown, various surface features of the bi-directional fan system 500 may be visible to user through one or more openings 585, such as a direction indicator 528. As such, the one or more openings 585 are configured to provide a quick and intuitive perspective view for users to easily identify the path of airflow with respect to the device. This greatly assists in proper installation and maintenance of the equipment, ensuring optimal cooling and ventilation for reliable operation of various systems, without limitation.

In some embodiments, the securing tab 570 may comprise one or more surface features, including for example a direction indicator 528. As shown, the direction indicator 528 may be formed as an arrow or any other shape that helps users identify an orientation for inserting the fan into a respective or designated slot, thereby ensuring that the fan is aligned correctly with the desired airflow direction and securely seated, reducing the risk of improper installation. In larger server installations or data centers, where numerous fans are present, having clear indicators on the securing tabs saves time during maintenance or replacement tasks. Technicians can quickly identify the correct orientation without needing to refer to documentation or risk trial and error. The direction indicator 528 provides a visual cue, reducing the likelihood of user errors during fan installation. This is particularly helpful for individuals who are less experienced with hardware installations or for situations where documentation might not be readily available.

In a variety of embodiments, the reconfigurable fan component 505 may be configured to have one or more side tabs 520 that may, for example, enable the reconfigurable fan component 505 to be inserted into a fan housing 510 having differing connection types, such as, for example, the securing mechanism depicted in the fan housing 310 of FIG. 3A. Additionally, in some embodiments, the reconfigurable fan component 505 may be configured with one or more through holes that may, for example, enable the reconfigurable fan component 505 to be coupled with additional housing types such as the connection method depicted in FIGS. 4A-4E.

Referring to FIG. 5C, a close-up perspective view of a locking mechanism of a configurable bi-directional airflow system in accordance with various embodiments of the disclosure is shown. In many embodiments, as may be shown in FIG. 5C, the securing tab 570 may be configured to extend across upon one portion of the reconfigurable fan component 505 and wherein the hinged member 580 may also be configured to extend across a different portion of the reconfigurable fan component 505 to cover additional surface of the reconfigurable fan component 505 that may be, for example, shaped having multiple different surfaces. In many additional embodiments, the reconfigurable fan component 505 may be configured to have more than one through hole, as is shown in an embodiment of FIG. 5C so that an engagement mechanism such as the pin component 565 or other variations may engage with the reconfigurable fan component 505 whether it is placed in the fan housing 510 facing one direction or the opposite direction. For example, the reconfigurable fan component 505 may be rotated to provide a different direction of airflow and because the reconfigurable fan component 505 may be configured to have one or more through holes it may be secured by engaging the pin component 565 with such one or more through holes in either position.

Although a specific embodiment for a bi-directional fan system 500 having a securing method that utilizes a hinged member 580, a securing tab 570, and a pin component 565 may be suitable for carrying out the various steps, processes, methods, and operations described herein is discussed with respect to FIGS. 5A-5C, any of a variety of systems and/or processes may be utilized in accordance with embodiments of the disclosure. The elements depicted in FIGS. 5A-5C may also be interchangeable with other elements of FIGS. 3A-3C, 4A-4F, and 6A-6B as required to realize a particularly desired embodiment.

Figure 6A:
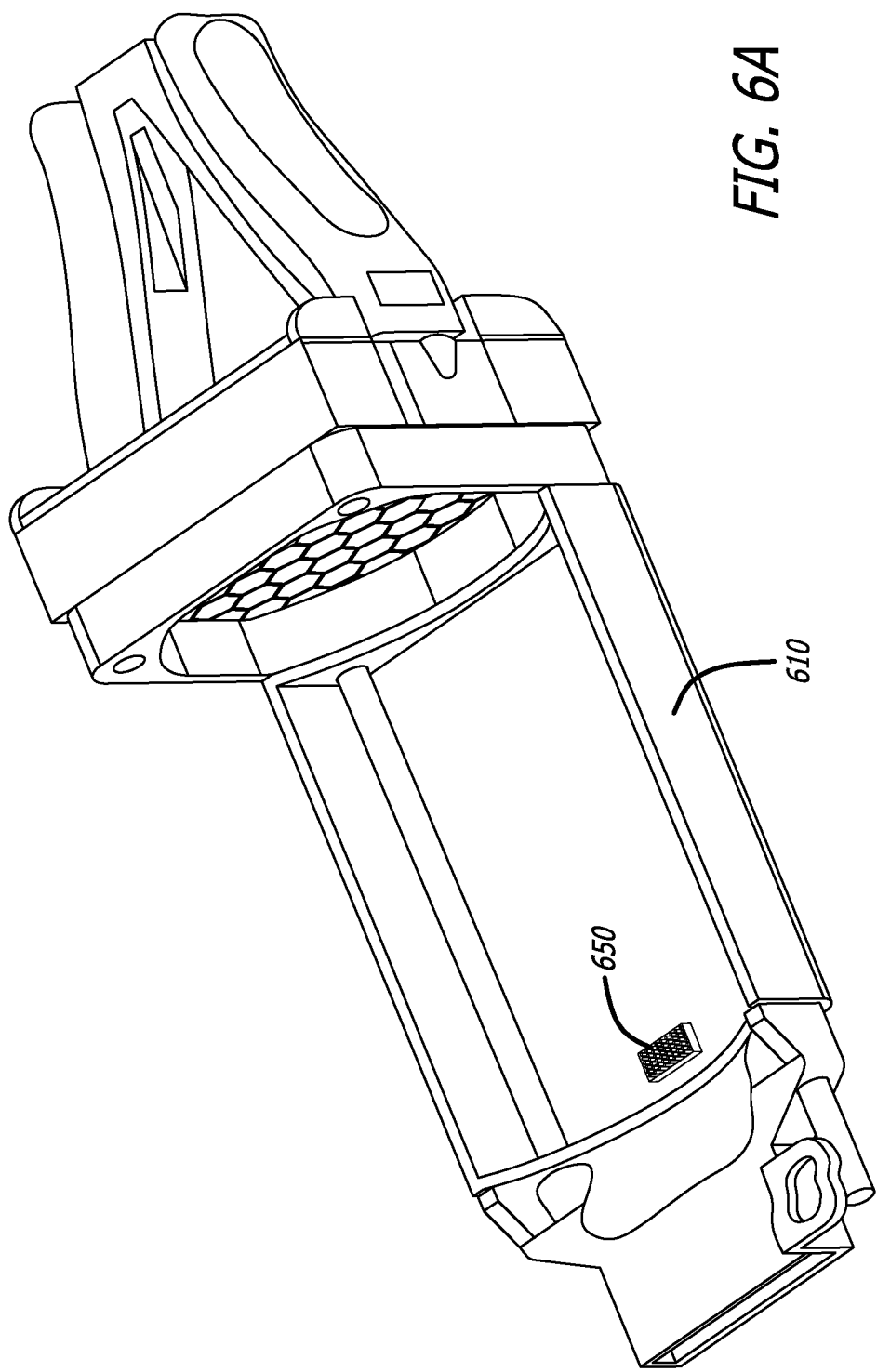
FIG. 6A provides a perspective view of a schematic illustrating a fan housing having a mating receptacle on a first end of the fan housing in accordance with various embodiments of the disclosure.
Figure 6B:
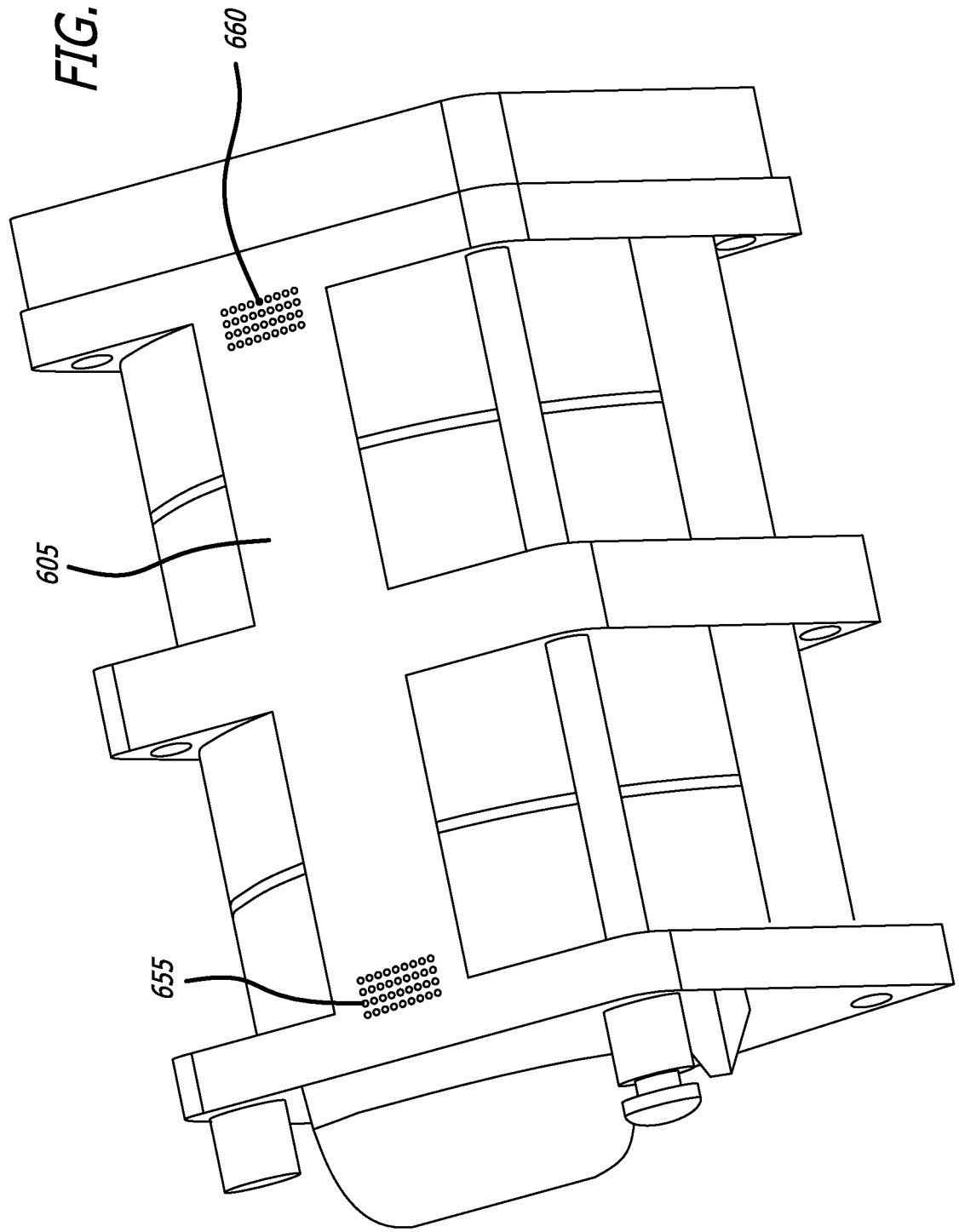
FIG. 6B provides a perspective view of a schematic illustrating a configurable bi-directional airflow system having mating connectors on a first end of the configurable bi-directional airflow system and on a second end of the configurable bi-directional airflow system in accordance with various embodiments of the disclosure.

Referring to FIGS. 6A and 6B, a perspective view of a schematic illustrating a fan housing having a mating receptacle on a first end of the fan housing in accordance with various embodiments of the disclosure is shown. In a variety of embodiments, the fan housing 610 may be configured with a plurality of walls for engaging with a reconfigurable fan component 605, as well as a housing mating component 650 configured in a manner to engage with, for example, a first fan mating component 655 or a second fan mating component 660 of a reconfigurable fan component 605. In some embodiments, the first fan mating component 655 and the second fan mating component 660 comprise mirror identical connectors for plug-and-play use in the field. Accordingly, it should be appreciated that the first fan mating component 655 and the second fan mating component 660 may each correspond to a forward flow or a reverse flow depending on the installation.

In some embodiments, the first fan mating component 655 and the second fan mating component 660 may be configured opposing ends of the reconfigurable fan component and as mating receptacles on a printed circuit board (PCB) assembly. For example, the PCB assembly could include a specific mating receptacle designed to accommodate any of various bi-directional and/or reversible fans. The first fan mating component 655, for example, could include a plurality of pins or connectors arranged in a specific pattern to ensure proper alignment and electrical connectivity. To that end, a reversible, bi-directional fan such as the ones shown with respect to any of the various embodiments described herein, would be securely mounted onto the PCB assembly, aligning its corresponding connectors with the mating receptacle on the PCB. In various embodiments, the first fan mating component 655's pins may be configured to fit into the fan's connectors, thereby establishing a physical and electrical connection.

In additional embodiments, the first fan mating component 655 is configured to provide an electrically coupled connection between the reversible fan and the PCB assembly through one of the fan mating components. This would typically involve multiple electrical connections, such as power supply lines, control signals, and possibly communication interfaces, depending on the specific requirements of the fan and the system it is integrated with. In some embodiments, the fan mating components and/or the housing mating component can be at least partially magnetized to ensure a proper electrical or other signal connection.

To enable bi-directional control of the fan, the PCB assembly may be configured to incorporate requisite circuitry and components. In some embodiments, this may include a motor driver circuit that can reverse the direction of the fan's rotation based on control signals received from the PCB. The control signals may be configured for transmission through the first fan mating component 655 to one or more connectors of the fan, thereby allowing the PCB assembly to regulate the fan's rotation direction, for example.

By utilizing the mating receptacle on the PCB assembly, the reversible fan may be easily integrated and controlled within a larger system. The mating receptacle ensures a secure physical connection and facilitates the transmission of electrical signals required for bi-directional control of the fan. With respect to system integration, the PCB assembly and the reversible fan and associated components, may be integrated into a larger system. This could be a cooling system, ventilation system, or any application where the ability to change the direction of airflow is beneficial, without limitation. The system may be configured to provide requisite power and control signals to the PCB assembly, allowing it to control the reversible fan accordingly.

In many embodiments, the fan housing 610 as depicted in FIG. 6A, may be interchanged and work with any embodiments described herein such as, for example, with the attachment mechanisms of FIGS. 3A-3C, 4A-4E, and 5A-5C or any of the reconfigurable fan component 605 depicted in FIGS. 3A-3C, 4A-4E, and 5A-5C.

In the embodiment depicted in FIG. 6B a perspective view of a schematic illustrating a configurable bi-directional airflow system having mating connectors on a first end of the configurable bi-directional airflow system and on a second end of the configurable bi-directional airflow system in accordance with various embodiments of the disclosure is shown. In additional embodiments, the reconfigurable fan component 605 may be configured with a first fan mating component 655 and a second fan mating component 660. In further embodiments, the first fan mating component 655 of the reconfigurable fan component 605 may be configured to enable it to engage with a housing mating component 650 when the reconfigurable fan component 605 is in an attached state with the fan housing 610. Additionally, the reconfigurable fan component 605 of many embodiments, may be configured with a second fan mating component 660 that may be engaged with a housing mating component 650 of the fan housing 610 when the reconfigurable fan component 605 is reconfigured to be engaged with the fan housing 610 in the opposite direction. In many further embodiments, no matter the portion the reconfigurable fan component 605 is in when engaged with a fan housing 610 in an attached state, there will be an engagement mechanism on both the reconfigurable fan component 605 and the fan housing 610 that align and may interconnect to provide communication, power, or other interconnected transmissions necessary for such components to work together.

Although a specific embodiment for a bi-directional fan system may be suitable for carrying out the various steps, processes, methods, and operations described herein is discussed with respect to FIGS. 6A and 6B, any of a variety of systems and/or processes may be utilized in accordance with embodiments of the disclosure. For example, the reconfigurable fan component 605 as depicted in FIG. 6B, may be interchanged and work with any embodiments described herein such as with the attachment mechanisms of FIGS. 3A-3C, 4A-4E, and 5A-5C or any of the fan housings 610 depicted in FIGS. 3A-3C, 4A-4E, and 5A-5C.

The techniques shown in the figures can be implemented using code and data stored and executed on one or more electronic devices. Such electronic devices store and communicate (internally and/or with other electronic devices over a network) code and data using computer-readable media, such as non-transitory computer-readable storage media (e.g., magnetic disks; optical disks; random access memory; read only memory; flash memory devices; phase-change memory) and transitory computer-readable transmission media (e.g., electrical, optical, acoustical or other form of propagated signals—such as carrier waves, infrared signals, digital signals).

The processes or methods depicted in the preceding figures can be performed by processing logic that includes hardware (e.g., circuitry, dedicated logic, etc.), firmware, software (e.g., embodied on a non-transitory computer readable medium), or a combination of both. Although the processes or methods are described above in terms of some sequential operations, it should be appreciated that some of the operations described can be performed in a different order. Moreover, some operations can be performed in parallel rather than sequentially.

While some particular embodiments have been provided herein, and while the particular embodiments have been provided in some detail, it is not the intention for the particular embodiments to limit the scope of the concepts presented herein. Additional adaptations and/or modifications can appear to those of ordinary skill in the art, and, in broader aspects, these adaptations and/or modifications are encompassed as well. Accordingly, departures can be made from the particular embodiments provided herein without departing from the scope of the concepts provided herein.

What is claimed is:

1. A multi-directional fan system, comprising:
a reconfigurable fan component comprising:
  a first fan opening on one end of the reconfigurable fan component and a second fan opening on another end of the reconfigurable fan component; and
  a plurality of engagement components configured to secure the reconfigurable fan component in place with a fan housing;
  wherein the plurality of engagement components of the fan housing comprises a pair of engagement receptors on opposing sides of the fan housing, and a pair of valleys on opposing sides of the reconfigurable fan component; and
  wherein a first insertion nub is configured to engage with a first engagement receptor and first valley; and a second insertion nub is configured to engage with a second engagement receptor and second valley;
the fan housing comprising:
  a plurality of securing components configured to engage with the plurality of engagement components of the reconfigurable fan component to secure the reconfigurable fan component in place with the fan housing;
  an attached state wherein the reconfigurable fan component is securely attached to the fan housing; and
  a detached state wherein the reconfigurable fan component is detached from the fan housing.

2. The multi-directional fan system of claim 1, wherein the attached state further comprises:
a first airflow state wherein the reconfigurable fan component is configured in a first position within the fan housing; and
a second airflow state wherein the reconfigurable fan component is configured in a second position within the fan housing.

3. The multi-directional fan system of claim 2, wherein the second position of the reconfigurable fan component corresponds to a one-hundred-and-eighty-degree orientation with respect to the first position.

4. The multi-directional fan system of claim 2, wherein the first airflow state is associated with airflow in a first direction.

5. The multi-directional fan system of claim 4, wherein the second airflow state is associated with airflow in a second direction.

6. The multi-directional fan system of claim 5, wherein the first airflow state and the second airflow state are in opposing directions.

7. The multi-directional fan system of claim 1, wherein the attached state is achieved via the engagement of a plurality of hinged securing members.

8. The multi-directional fan system of claim 7, wherein the plurality of hinged securing members is configured with at least one locking engagement component.

9. The multi-directional fan system of claim 7, wherein a locking engagement component is configured to engage with a corresponding through hole in the reconfigurable fan component.

10. The multi-directional fan system of claim 1, wherein the attached state is achieved via a securing tab.

11. The multi-directional fan system of claim 10, wherein the securing tab is configured to be secured via a pin component.

12. A multi-directional fan system, comprising:
a fan housing comprising:
 a plurality of securing components configured to engage with a plurality of engagement components of a reconfigurable fan component to secure the reconfigurable fan component in place with the fan housing; and
 a housing mating component configured to engage with a fan mating component; and
 wherein the plurality of engagement components of the fan housing comprises a pair of engagement receptors on opposing sides of the fan housing and a pair of valleys on opposing sides of the reconfigurable fan component; and
 wherein a first insertion nub is configured to engage with a first engagement receptor and first valley; and a second insertion nub is configured to engage with a second engagement receptor and second valley;
a reconfigurable fan component comprising:
 a first fan opening on one end of the reconfigurable fan component and a second fan opening on another end of the reconfigurable fan component;
 a plurality of engagement components configured to secure the reconfigurable fan component in place with a fan housing;
 a first fan mating component; and
 a second fan mating component.

13. The multi-directional fan system of claim 12, wherein the first fan mating component and second fan mating component are configured on opposing ends of the reconfigurable fan component.

14. The multi-directional fan system of claim 13, wherein the housing mating component is configured to deliver power to the reconfigurable fan component via an electrically coupled connection through one of the fan mating components.

15. The multi-directional fan system of claim 14, wherein the housing mating component is at least partially magnetized.

16. The multi-directional fan system of claim 14, wherein both the first and second fan mating component is at least partially magnetized.

17. A method for reversing airflow of a multi-directional fan system comprising:
accessing a reconfigurable fan component secured within a fan housing via a plurality of securing components that comprise a pair of engagement receptors on opposing sides of the fan housing and a pair of valleys on opposing sides of the reconfigurable fan component;
configuring a first insertion nub to engage with a first engagement receptor and first valley; and configuring a second insertion nub to engage with a second engagement receptor and second valley;
detaching one or more of the plurality of securing components;
removing the reconfigurable fan component from the fan housing;
rotating the reconfigurable fan component one-hundred-and-eighty-degrees;
placing the reconfigurable fan component back into the fan housing in a rotated position; and
securing the reconfigurable fan component within the fan housing via a plurality of securing components.

18. The method of claim 17, wherein detaching and securing the multi-directional fan system does not require any tools.

\* \* \* \* \*